United States Patent
Huang

(10) Patent No.: US 12,279,456 B2
(45) Date of Patent: *Apr. 15, 2025

(54) SEMICONDUCTOR DEVICE WITH BURIED GATE STRUCTURES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 88 days.

This patent is subject to a terminal disclaimer.

(21) Appl. No.: 18/368,689

(22) Filed: Sep. 15, 2023

(65) Prior Publication Data

US 2024/0088249 A1    Mar. 14, 2024

Related U.S. Application Data

(62) Division of application No. 17/940,362, filed on Sep. 8, 2022.

(51) Int. Cl.
*H10D 64/27* (2025.01)
*H10B 12/00* (2023.01)

(52) U.S. Cl.
CPC ......... *H10D 64/513* (2025.01); *H10B 12/053* (2023.02); *H10B 12/34* (2023.02)

(58) Field of Classification Search
None
See application file for complete search history.

(56) References Cited

U.S. PATENT DOCUMENTS

| 11,456,379 B1 * | 9/2022 | Chuang ............... H10D 64/111 |
| 2002/0179967 A1 | 12/2002 | Fujishima |
| 2015/0041909 A1 | 2/2015 | Bouche et al. |

(Continued)

FOREIGN PATENT DOCUMENTS

TW    200941725 A    10/2009

OTHER PUBLICATIONS

Office Action and and the search report mailed on Sep. 12, 2024 related to Taiwanese Application No. 112143872.

(Continued)

*Primary Examiner* — Hsien Ming Lee
(74) *Attorney, Agent, or Firm* — Xuan Zhang

(57) ABSTRACT

The present disclosure provide a semiconductor device and a method for preparing the semiconductor device. The semiconductor device includes a first buried gate structure and a second buried gate structure disposed in a semiconductor substrate. The first buried gate structure includes a first gate dielectric layer, and a first lower semiconductor layer disposed over the first gate dielectric layer. The first lower semiconductor layer has a T-shaped profile in a cross-sectional view. The first buried gate structure also includes a first upper semiconductor layer disposed over the first lower semiconductor layer. The second buried gate structure includes a second gate dielectric layer, and a second lower semiconductor layer disposed over the second gate dielectric layer. The second lower semiconductor layer has a U-shaped profile in the cross-sectional view. The second buried gate structure also includes a second upper semiconductor layer disposed over the second lower semiconductor layer.

15 Claims, 28 Drawing Sheets

(56) References Cited

U.S. PATENT DOCUMENTS

2016/0204221 A1 7/2016 He et al.
2018/0323113 A1 11/2018 Patil

OTHER PUBLICATIONS

Office Action and and the search report mailed on May 10, 2024 related to Taiwanese Application No. 112143872.
Office Action mailed on Oct. 4, 2023 related to Taiwanese Application No. 112109848.

\* cited by examiner

SEMICONDUCTOR DEVICE WITH BURIED GATE STRUCTURES

CROSS-REFERENCE TO RELATED APPLICATION

This application is a divisional application of U.S. Non-Provisional application Ser. No. 17/940,362 filed Sep. 8, 2022, which is incorporated herein by reference in its entirety.

TECHNICAL FIELD

The present disclosure relates to a semiconductor device and a method for preparing the same, and more particularly, to a semiconductor device with buried gate structures and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first buried gate structure disposed in a semiconductor substrate, and a second buried gate structure disposed in the semiconductor substrate and spaced from the first buried gate structure. The first buried gate structure includes a first gate dielectric layer, and a first lower semiconductor layer disposed over the first gate dielectric layer. The first lower semiconductor layer has a T-shaped profile in a cross-sectional view. The first buried gate structure also includes a first upper semiconductor layer disposed over the first lower semiconductor layer. The second buried gate structure includes a second gate dielectric layer, and a second lower semiconductor layer disposed over the second gate dielectric layer. The second lower semiconductor layer has a U-shaped profile in the cross-sectional view. The second buried gate structure also includes a second upper semiconductor layer disposed over the second lower semiconductor layer.

In an embodiment, the first buried gate structure has a first width, the second buried gate structure has a second width, and the second width is greater than the first width. In an embodiment, the first lower semiconductor layer and the first upper semiconductor layer form a planar interface. In an embodiment, the first lower semiconductor layer and the second lower semiconductor layer include polysilicon or silicon germanium (SiGe), and the first upper semiconductor layer and the second upper semiconductor layer comprise germanium (Ge). In an embodiment, the first buried gate structure is disposed in an array region, and the second buried gate structure is disposed in a peripheral circuit region. In an embodiment, the second upper semiconductor layer extends lower than a top surface of the second gate dielectric layer. In an embodiment, the top surface of the second gate dielectric layer is covered by the second lower semiconductor layer.

In an embodiment, the semiconductor device further includes a third buried gate structure disposed in the semiconductor substrate and spaced from the first buried gate structure and the second buried gate structure. The third buried gate structure includes a third gate dielectric layer, a work function metal layer disposed over the third gate dielectric layer. The third buried gate structure also includes a third lower semiconductor layer disposed over the third work function metal layer. The third lower semiconductor layer has a U-shaped profile in the cross-sectional view. The third buried gate structure further includes a third upper semiconductor layer disposed over the third lower semiconductor layer. In an embodiment, the first buried gate structure has a first width, the third buried gate structure has a third width, and the third width is greater than the first width. In an embodiment, the first buried gate structure is disposed in an array region, and the second buried gate structure and the third gate structure are disposed in a peripheral circuit region, wherein the second buried gate structure is in an n-type field effect transistor (NFET), and the third buried gate structure is in a p-type field effect transistor (PFET). In an embodiment, the third upper semiconductor layer extends lower than a top surface of the work function metal layer. In an embodiment, the top surface of the work function metal layer is covered by the third lower semiconductor layer.

In another embodiment of the present disclosure, a semiconductor device is provided. The semiconductor device includes a first buried gate structure, a second buried gate structure, and a third buried gate structure disposed in a semiconductor substrate. The first buried gate structure includes a first gate dielectric layer, a first lower semiconductor layer disposed over the first gate dielectric layer, and a first upper semiconductor layer disposed over the first lower semiconductor layer. An interface between the first lower semiconductor layer and the first upper semiconductor layer is planar. The second buried gate structure includes a second gate dielectric layer, a second lower semiconductor layer disposed over the second gate dielectric layer, and a second upper semiconductor layer disposed over the second lower semiconductor layer. An interface between the second lower semiconductor layer and the second upper semiconductor layer is U-shaped. The third buried gate structure includes a third gate dielectric layer, a work function metal layer disposed over the third gate dielectric layer, a third lower semiconductor layer disposed over the work function metal layer, and a third upper semiconductor layer disposed over the third lower semiconductor layer. An interface between the third lower semiconductor layer and the third upper semiconductor layer is U-shaped.

In an embodiment, the first buried gate structure has a first width, the second buried gate structure has a second width, the third buried gate structure has a third width, and the first width is less than the second width and the third width. In an embodiment, the first buried gate structure is disposed in an array region, and the second buried gate structure and the third buried gate structure are disposed in a peripheral circuit region. In an embodiment, the first buried gate structure is in a first n-type field effect transistor (NFET), the second buried gate structure is in a second n-type field effect transistor (NFET), and the third buried gate structure is in a p-type field effect transistor (PFET). In an embodiment, the first lower semiconductor layer, the second lower semiconductor layer, and the third lower semiconductor layer comprise polysilicon or silicon germanium (SiGe).

In an embodiment, the first upper semiconductor layer, the second upper semiconductor layer, and the third upper semiconductor layer comprise germanium (Ge). In an embodiment, the semiconductor device further includes a first isolation layer disposed in the semiconductor substrate and over the first buried gate structure, wherein the first lower semiconductor layer is separated from the first isolation layer by the first upper semiconductor layer. In an embodiment, the semiconductor device also includes a second isolation layer disposed in the semiconductor substrate and over the second buried gate structure, wherein the second lower semiconductor layer is separated from the second isolation layer by the second upper semiconductor layer, and wherein a width of the second isolation layer is greater than a width of the first isolation layer.

In yet another embodiment of the present disclosure, a method for preparing a semiconductor device is provided. The method includes forming a first trench and a second trench in a semiconductor substrate, and forming a first gate dielectric layer lining the first trench, and forming a second gate dielectric layer lining the second trench. The method also includes depositing a lower semiconductor material over the semiconductor substrate, wherein the first gate dielectric layer and the second gate dielectric layer are covered by the lower semiconductor material, and filling the first trench and the second trench with a sacrificial material after the lower semiconductor material is deposited. The method further includes etching the lower semiconductor material and the sacrificial material to form a first lower semiconductor layer in the first trench and to form a second lower semiconductor layer and a first sacrificial layer in the second trench. The first lower semiconductor layer has a T-shaped profile in a cross-sectional view, and the first sacrificial layer is surrounded by the second lower semiconductor layer. In addition, the method includes removing the first sacrificial layer, depositing a first upper semiconductor layer in the first trench and over the first lower semiconductor layer, and depositing a second upper semiconductor layer in the second trench and over the second lower semiconductor layer.

In an embodiment, the first trench has a first width, the second trench has a second width, and the second width is greater than the first width. In an embodiment, the first lower semiconductor layer and the first upper semiconductor layer form a planar interface. In an embodiment, the first trench is in an array region, and the second trench is in a peripheral circuit region. In an embodiment, after the first upper semiconductor layer and the second upper semiconductor layer are deposited, remaining portions of the first trench and the second trench are filled with a first isolation layer and a second isolation layer, respectively. In an embodiment, before the lower semiconductor material and the sacrificial material are etched, the sacrificial material has a first bottom surface in the first trench, and the first bottom surface of the sacrificial material is higher than a top surface of the first gate dielectric layer. In an embodiment, before the lower semiconductor material and the sacrificial material are etched, the sacrificial material has a second bottom surface in the second trench, and the second bottom surface of the sacrificial material is lower than a top surface of the second gate dielectric layer.

In an embodiment, the method further includes forming a third trench in the semiconductor substrate, forming a third gate dielectric layer lining the third trench, and forming a work function metal layer over the third gate dielectric layer. In addition, the method includes depositing the lower semiconductor material in the third trench and covering the work function metal layer, filling the third trench with the sacrificial material after the lower semiconductor material is deposited, and etching the lower semiconductor material and the sacrificial material to form a third lower semiconductor layer and a second sacrificial layer in the third trench. The second sacrificial layer is surrounded by the third lower semiconductor layer. In an embodiment, the third trench has a third width, and the third width is greater than the first width. In an embodiment, a width of the first sacrificial layer is greater than a width of the second sacrificial layer. In an embodiment, the first trench is in an array region, and the second trench and the third trench are in a peripheral circuit region. In an embodiment, the method further includes removing the second sacrificial layer, and depositing a third upper semiconductor layer in the third trench and over the third lower semiconductor layer.

Embodiments of a semiconductor device and method for preparing the same are provided in the disclosure. In some embodiments, the semiconductor device includes a first buried gate structure and a second buried gate structure disposed in a semiconductor substrate. The first buried gate structure includes a first lower semiconductor layer and a first upper semiconductor layer disposed over a first gate dielectric layer. The second buried gate structure includes a second lower semiconductor layer and a second upper semiconductor layer disposed over a second gate dielectric layer. In some embodiments, the first lower semiconductor layer has a T-shaped profile, and the second lower semiconductor layer has a U-shaped profile. The different profiles are formed by depositing a lower semiconductor material in trenches with different widths, and etching the lower semiconductor material to form the first lower semiconductor layer and the second lower semiconductor layer. The trenches with different widths are in different device regions, and the first buried gate structure and the second buried gate structure are subsequently formed in the trenches. Therefore, the buried gate structures in different device regions may be formed in the same process. As a result, manufacturing cost and processing time can be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
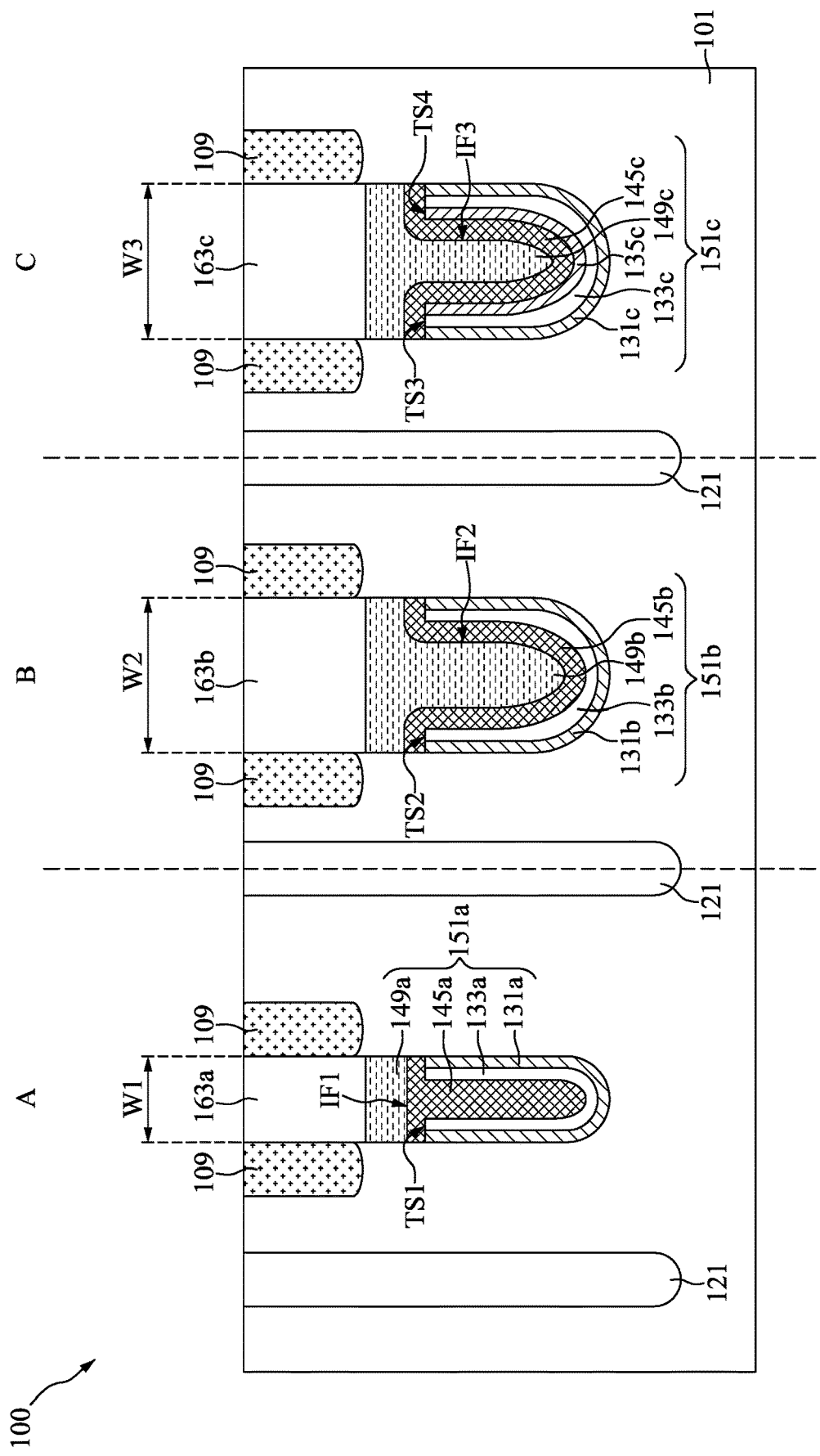
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. In some embodiments, the semiconductor device 100 includes a semiconductor substrate 101, and a plurality of isolation structures 121 disposed in the semiconductor substrate 101. In some embodiments, the isolation structures 121 define a plurality of device regions (i.e., the active areas of the device regions). For example, a first device region A, a second device region B, and a third device region C are defined by the isolation structures 121 in the semiconductor substrate 101, as shown in FIG. 1 in accordance with some embodiments.

In some embodiments, a plurality of source/drain regions 109 are formed in the semiconductor substrate 101. Each device region has at least two source/drain regions 109. Moreover, a plurality of buried gate structures are disposed in the semiconductor substrate 101 and between the source/drain regions 109. For example, a buried gate structure 151a (also referred to as a first buried gate structure) is disposed between the two source/drain regions 109 in the first device region A, a buried gate structure 151b (also referred to as a second buried gate structure) is disposed between the two source/drain regions 109 in the second device region B, and a buried gate structure 151c (also referred to as a third buried gate structure) is disposed between the two source/drain regions 109 in the third device region C.

In some embodiments, the first device region A is in an array region, and the second device region B and the third device region C are in a peripheral circuit region, which will be described in greater detail later. The buried gate structure 151a has a width W1, the buried gate structure 151b has a width W2, and the buried gate structure 151c has a width W3. In some embodiments, the width W2 and the width W3 are greater than the width W1. In some embodiments, the width W2 is substantially the same as the width W3. Within the context of this disclosure, the word "substantially" means preferably at least 90%, more preferably 95%, even more preferably 98%, and most preferably 99%.

In some embodiments, the buried gate structure 151a and the source/drain regions 109 arranged on opposite sides of the buried gate structure 151a collectively form an n-type field effect transistor (NFET) in an array region. In some embodiments, the buried gate structure 151b and the source/drain regions 109 arranged on opposite sides of the buried gate structure 151b collectively form an n-type field effect transistor (NFET) in a peripheral circuit region, and the buried gate structure 151c and the source/drain regions 109 arranged on opposite sides of the buried gate structure 151c collectively form a p-type field effect transistor (PFET) in the peripheral circuit region.

In some embodiments, the buried gate structure 151a in the first device region A includes an interfacial layer 131a, a gate dielectric layer 133a disposed over and surrounded by the interfacial layer 131a, a lower semiconductor layer 145a disposed over the gate dielectric layer 133a, and an upper semiconductor layer 149a disposed over the lower semiconductor layer 145a. In some embodiments, the lower semiconductor layer 145a has a T-shaped profile. In some embodiments, the lower semiconductor layer 145a has a lower portion surrounded by the gate dielectric layer 133a and an upper portion covering the top surfaces of the gate dielectric layer 133a and the interfacial layer 131a. For example, the top surface TS1 of the gate dielectric layer 133a is covered by and in direct contact with the upper portion of the lower semiconductor layer 145a.

Moreover, in some embodiments, the interface IF1 between the lower semiconductor layer 145a and the upper semiconductor layer 149a is substantially planar. In some embodiments, the interface IF1 between the lower semiconductor layer 145a and the upper semiconductor layer 149a is higher than the top surface TS1 of the gate dielectric layer 133a. In addition, the semiconductor device 100 includes an isolation layer 163a disposed in the semiconductor substrate 101 and over the buried gate structure 151a.

In some embodiments, the buried gate structure 151b in the second device region B includes an interfacial layer 131b, a gate dielectric layer 133b disposed over and surrounded by the interfacial layer 131b, a lower semiconductor layer 145b disposed over the gate dielectric layer 133b, and an upper semiconductor layer 149b disposed over the lower semiconductor layer 145b. In some embodiments, the lower semiconductor layer 145b has a U-shaped profile. In some embodiments, the lower semiconductor layer 145b has an upper portion covering the top surfaces of the gate dielectric layer 133b and the interfacial layer 131b. For example, the top surface TS2 of the gate dielectric layer 133b is covered by and in direct contact with the upper portion of the lower semiconductor layer 145b.

Moreover, in some embodiments, the interface IF2 between the lower semiconductor layer 145b and the upper semiconductor layer 149b is U-shaped. In some embodiments, the upper semiconductor layer 149b of the buried gate structure 151b extends lower than the top surface TS2 of the gate dielectric layer 133b. In addition, the semiconductor device 100 includes an isolation layer 163b disposed in the semiconductor substrate 101 and over the buried gate structure 151b.

In some embodiments, the buried gate structure 151c in the third device region C includes an interfacial layer 131c, a gate dielectric layer 133c disposed over and surrounded by the interfacial layer 131c, a work function metal layer 135c disposed over and surrounded by the gate dielectric layer 133c, a lower semiconductor layer 145c disposed over the work function metal layer 135c, and an upper semiconductor layer 149c disposed over the lower semiconductor layer 145c. In some embodiments, the lower semiconductor layer 145c has a U-shaped profile. In some embodiments, the lower semiconductor layer 145c has an upper portion covering the top surfaces of the work function metal layer 135c, the gate dielectric layer 133c and the interfacial layer 131b. For example, the top surface TS3 of the gate dielectric layer 133c and the top surface TS4 of the work function metal layer 135c are covered by and in direct contact with the upper portion of the lower semiconductor layer 145c.

Moreover, in some embodiments, the interface IF3 between the lower semiconductor layer 145c and the upper semiconductor layer 149c is U-shaped. In some embodiments, the upper semiconductor layer 149c of the buried gate structure 151c extends lower than the top surface TS4 of the work function metal layer 135c. In addition, the semiconductor device 100 includes an isolation layer 163c disposed in the semiconductor substrate 101 and over the buried gate structure 151c.

In some embodiments, the semiconductor device 100 is part of dynamic random access memory (DRAM), and the buried gate structure 151a in the first device region A forms a word line (WL) in an array region of the DRAM. In some embodiments, the lower semiconductor layer 145a of the buried gate structure 151a in the first device region A has a T-shaped profile, and the lower semiconductor layers 145b and 145c of the buried gate structures 151b and 151c in the second device region B and the third device region C have U-shaped profiles. The different profiles are formed by depositing a lower semiconductor material in trenches with different widths, and etching the lower semiconductor material to form the lower semiconductor layers 145a, 145b and 145c. The trenches in different device regions have different widths (e.g., the width of the trench(es) in the array region may be different from the width of the trench(es) in the peripheral circuit region), and the buried gate structures 151a, 151b and 151c are subsequently formed in the trenches. In the present embodiment, the buried gate structures in different device regions may be formed in the same process. As a result, manufacturing cost and processing time can be reduced.

Figure 2:
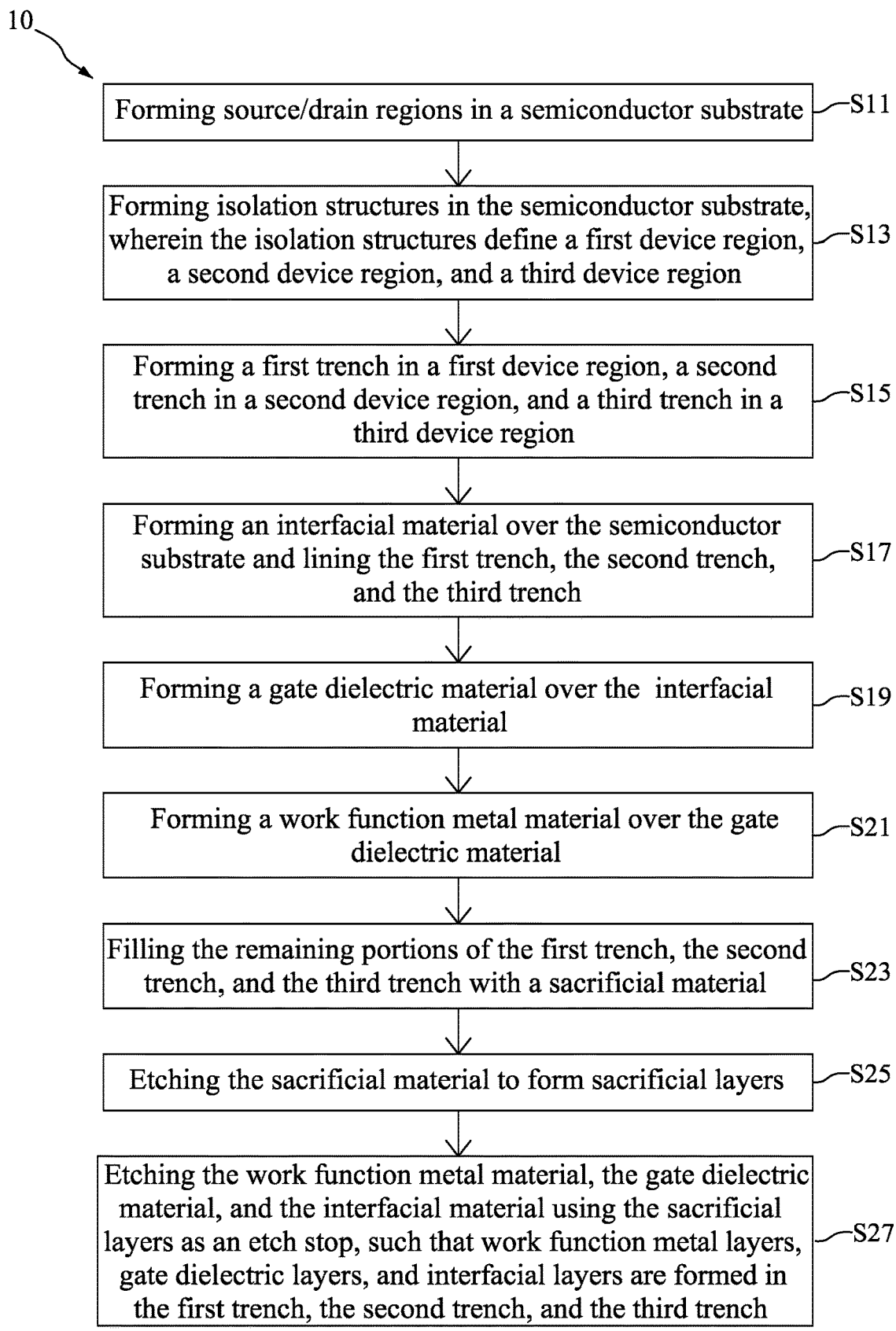
FIGS. 2 and 3 are flow diagrams illustrating a method for preparing a semiconductor device, in accordance with some embodiments.
Figure 3:
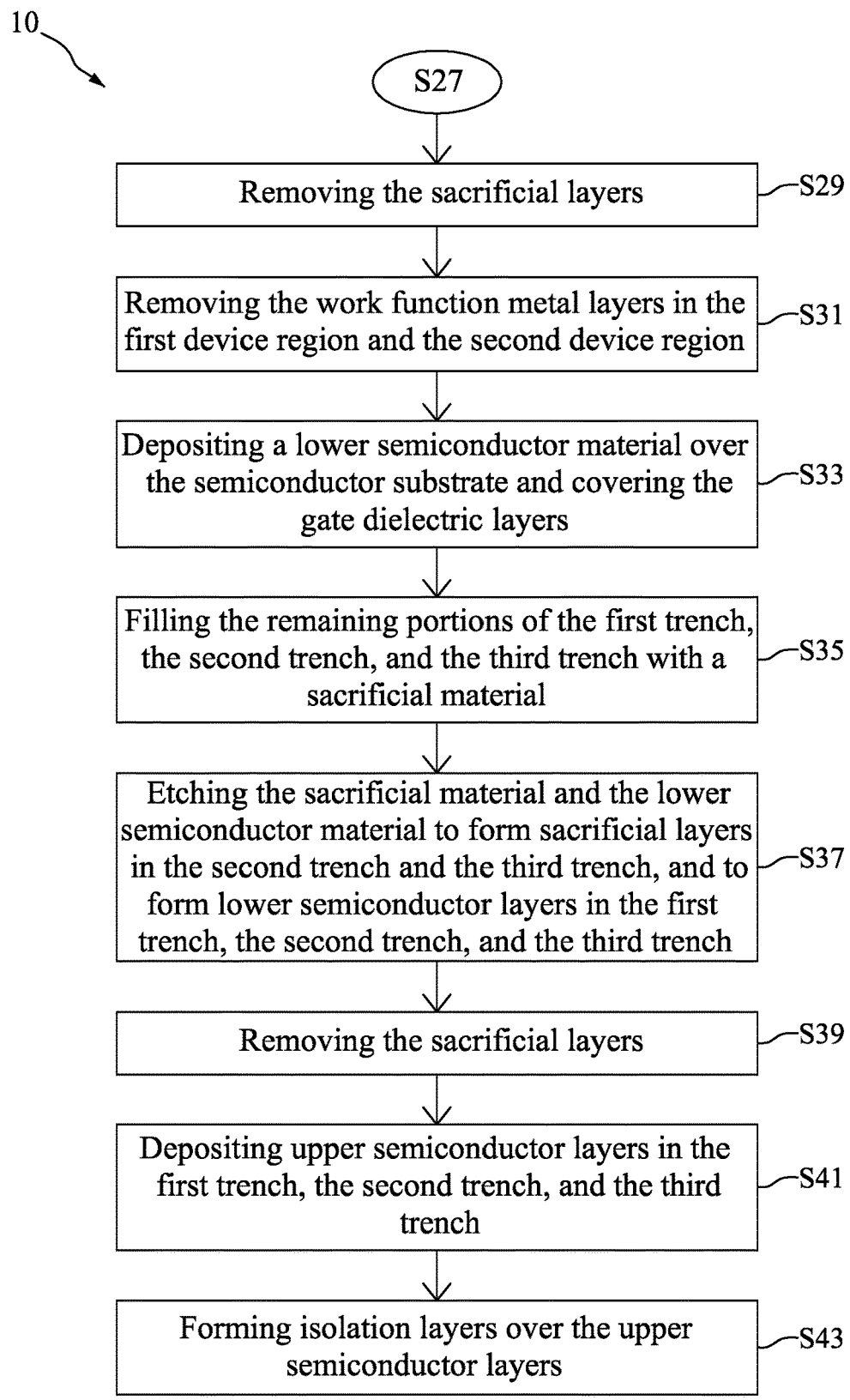

FIGS. 2 and 3 are flow diagrams illustrating a method 10 for preparing a semiconductor device (e.g., the semiconductor device 100), and the method 10 includes steps S11, S13, S15, S17, S19, S21, S23, S25, S27, S29, S31, S33, S35, S37, S39, S41 and S43, in accordance with some embodiments. The steps S11 to S43 of FIGS. 2 and 3 are elaborated in connection with the following figures.

Figure 4:
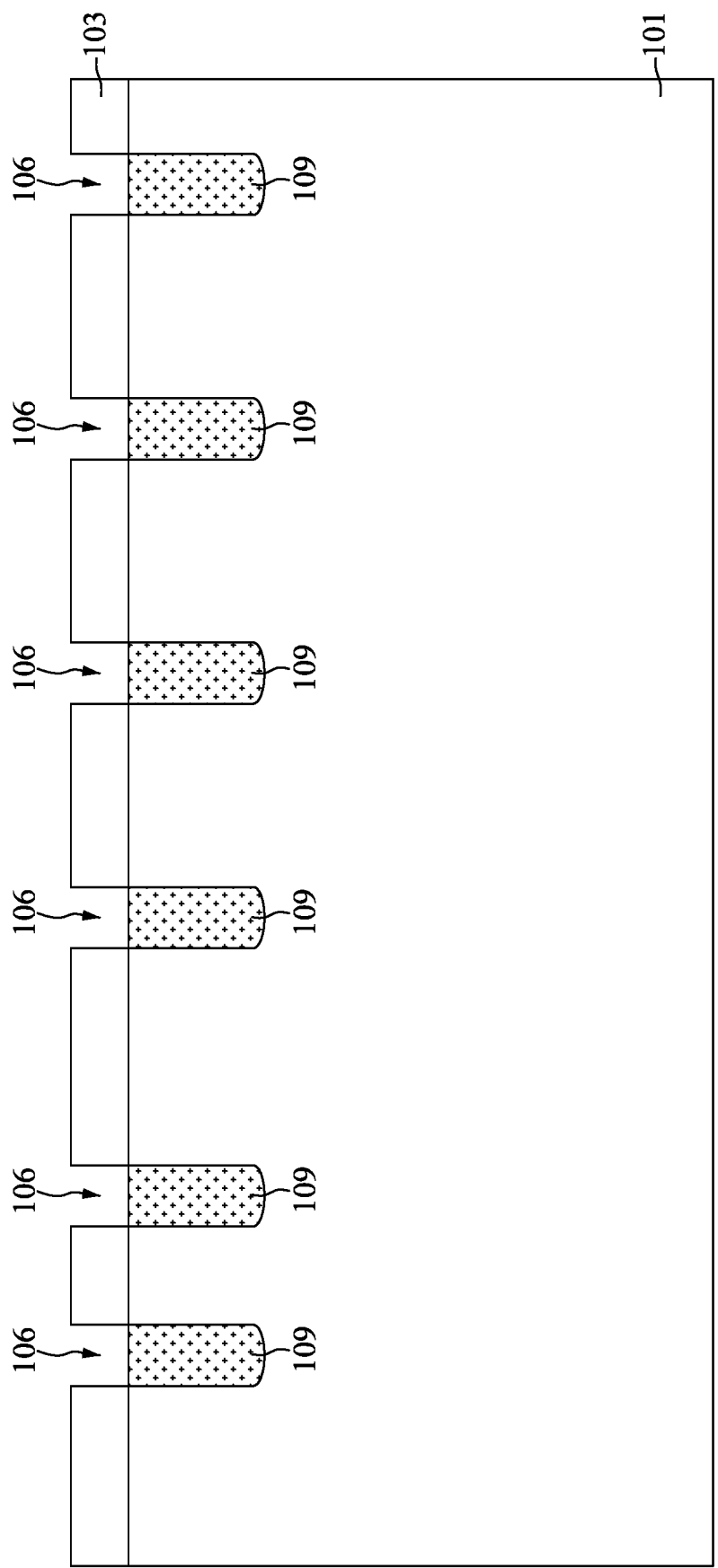
FIG. 4 is a cross-sectional view illustrating an intermediate stage of forming source/drain regions in a semiconductor substrate using a patterned mask during the formation of the semiconductor device, in accordance with some embodiments.

FIGS. 4-23 are cross-sectional views illustrating intermediate stages in the formation of the semiconductor device 100, in accordance with some embodiments. As shown in FIG. 4, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Moreover, in some embodiments, a plurality of source/drain regions (not shown) are formed in the semiconductor substrate 101.

A patterned mask 103 with a plurality of openings 106 is formed over the semiconductor substrate 101, and the patterned mask 103 is used in ion implantation process(es) to form a plurality of source/drain regions 109 in the semiconductor substrate 101, as shown in FIG. 4 in accordance with some embodiments. The respective step is illustrated as the step S11 in the method 10 shown in FIG. 2. In some embodiments, the semiconductor substrate 101 is partially exposed by the openings 106. In some embodiments, the source/drain regions 109 are formed by one or more ion implantation processes, and P-type dopants, such as boron (B), gallium (Ga), or indium (In), or N-type dopants, such as phosphorous (P) or arsenic (As), can be implanted in the semiconductor substrate 101, depending on the conductivity type of the device which will be subsequently formed in the semiconductor device 100.

Figure 5:
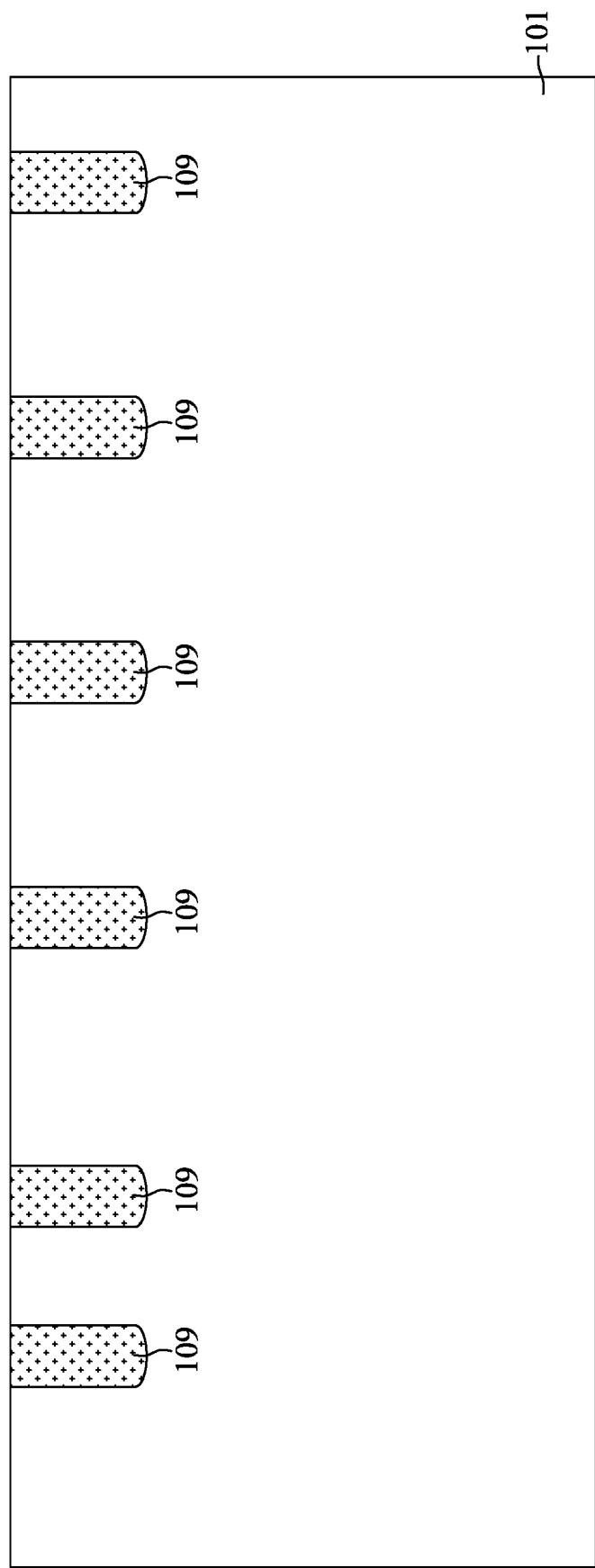
FIG. 5 is a cross-sectional view illustrating an intermediate stage of removing the patterned mask during the formation of the semiconductor device, in accordance with some embodiments.

Next, the patterned mask 103 is removed, as shown in FIG. 5 in accordance with some embodiments. In some embodiments, the patterned mask 103 is removed by a stripping process, an ashing process, an etching process, or another suitable process.

Figure 6:
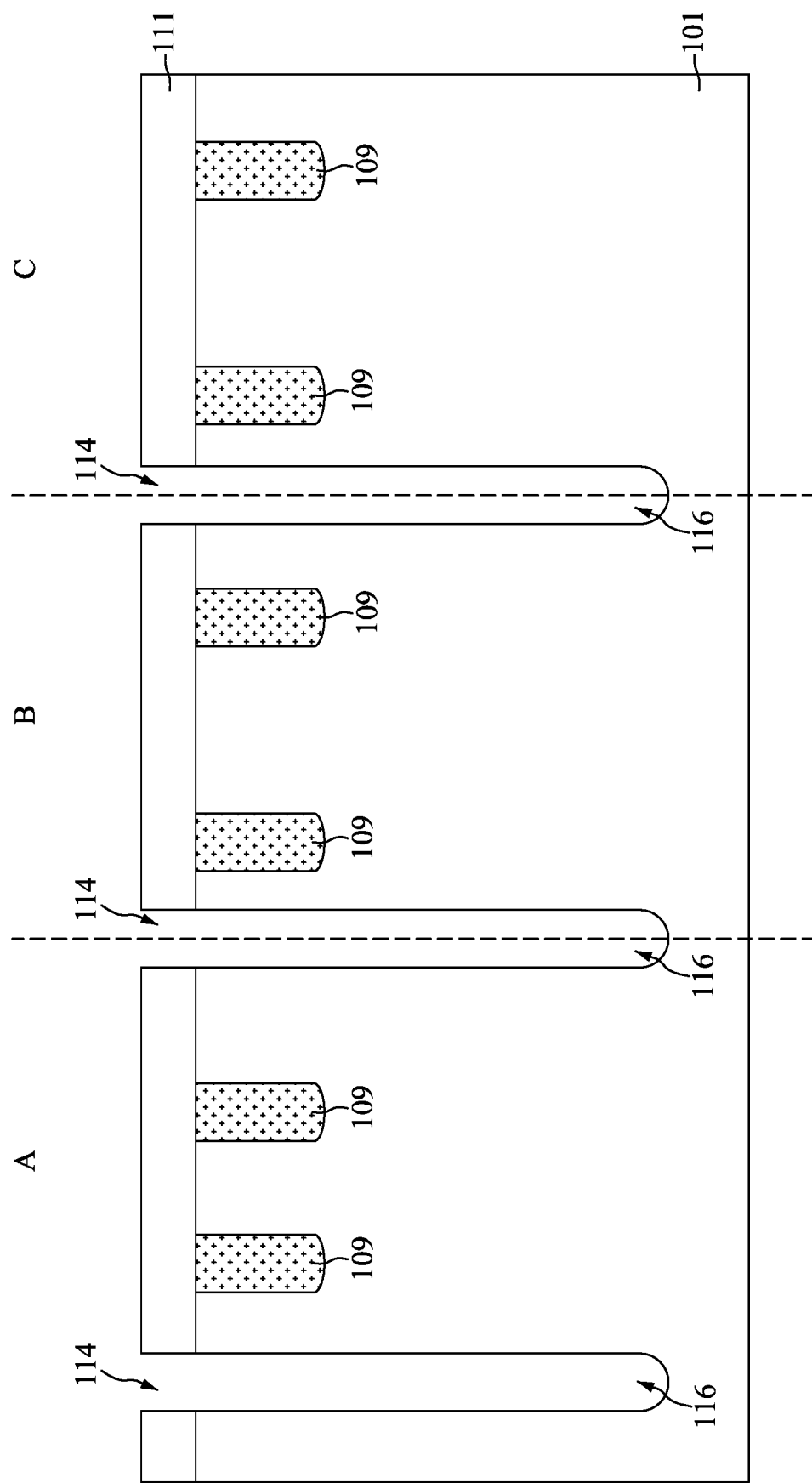
FIG. 6 is a cross-sectional view illustrating an intermediate stage of forming trenches in the semiconductor substrate to define device regions during the formation of the semiconductor device, in accordance with some embodiments.

Subsequently, a patterned mask 111 with a plurality of openings 114 is formed over the semiconductor substrate 101, and the patterned mask 111 is used in an etching process to form a plurality of trenches 116 in the semiconductor substrate 101, as shown in FIG. 6 in accordance with some embodiments. In some embodiments, the semiconductor substrate 101 is partially exposed by the openings 114. In some embodiments, the patterned mask 111 and the semiconductor substrate 101 include different materials so that the etching selectivities may be different in the subsequent etching process.

In some embodiments, the etching process includes a wet etching process, a dry etching process, or a combination thereof. The first device region A, the second device region B, and the third device region C (i.e., the active areas of the first device region A, the second device region B, and the third device region C) are defined by the trenches 116. In some embodiments, each device region has at least two source/drain regions 109.

Figure 7:
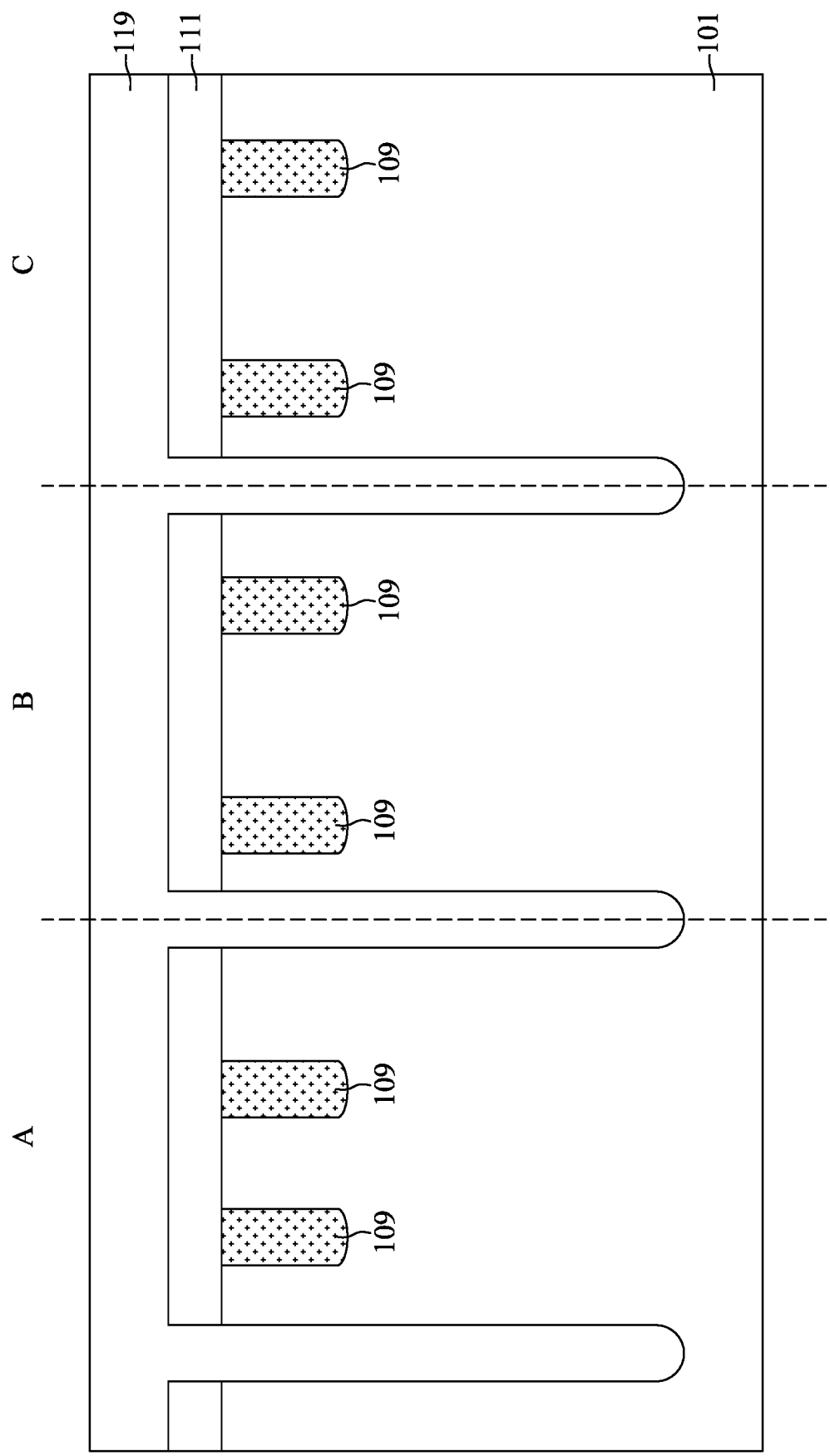
FIG. 7 is a cross-sectional view illustrating an intermediate stage of forming an isolation material in the trenches and over the semiconductor substrate during the formation of the semiconductor device, in accordance with some embodiments.

Then, an isolation material 119 is formed over the patterned mask 111, and the openings 114 and the trenches 116 are filled by the isolation material 119, as shown in FIG. 7 in accordance with some embodiments. In some embodiments, the isolation material 119 includes a dielectric material, such as silicon oxide, silicon nitride, silicon oxynitride. The isolation material 119 may be formed by a deposition process, such as a chemical vapor deposition (CVD) process, a physical vapor deposition (PVD) process, an ALD process, a spin-coating process, or another applicable process.

Figure 8:
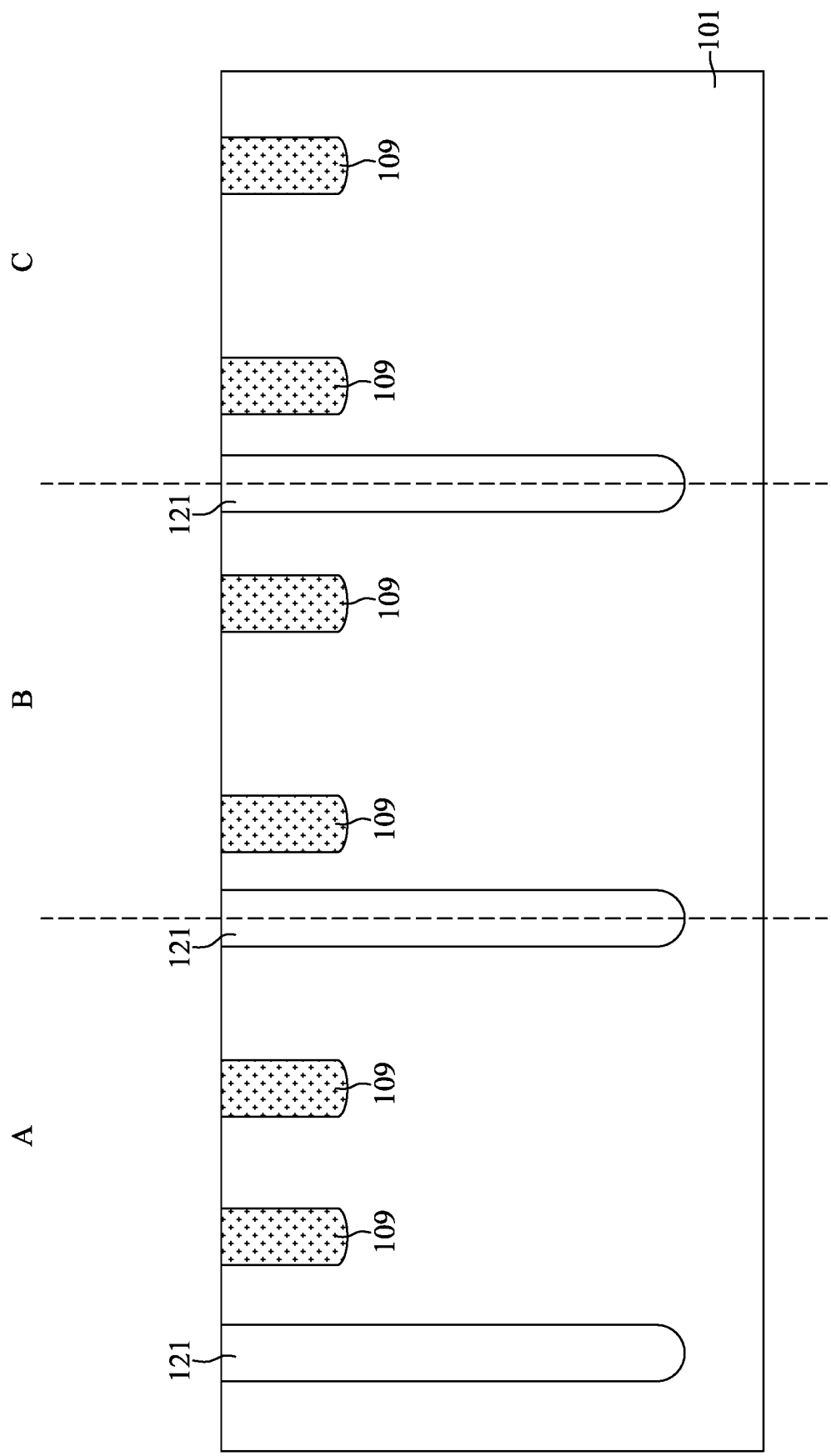
FIG. 8 is a cross-sectional view illustrating an intermediate stage of partially removing the isolation material to form isolation structures in the semiconductor substrate during the formation of the semiconductor device, in accordance with some embodiments.

Next, a planarization process is performed on the isolation material 119 to remove excess portions of the isolation material 119 over the semiconductor substrate 101, such that a plurality of isolation structures 121 are formed, as shown in FIG. 8 in accordance with some embodiments. The respective step is illustrated as the step S13 in the method 10 shown in FIG. 2. In some embodiments, the patterned mask 111 is removed during the planarization process, and the planarization process is performed until the semiconductor substrate 101 is exposed.

The planarization process may include a chemical mechanical polishing (CMP) process. After the planarization process is performed, remaining portions of the isolation material 119 form the isolation structures 121 in the semiconductor substrate 101. In some embodiments, the first device region A, the second device region B, and the third device region C are defined by the isolation structures 121.

Figure 9:
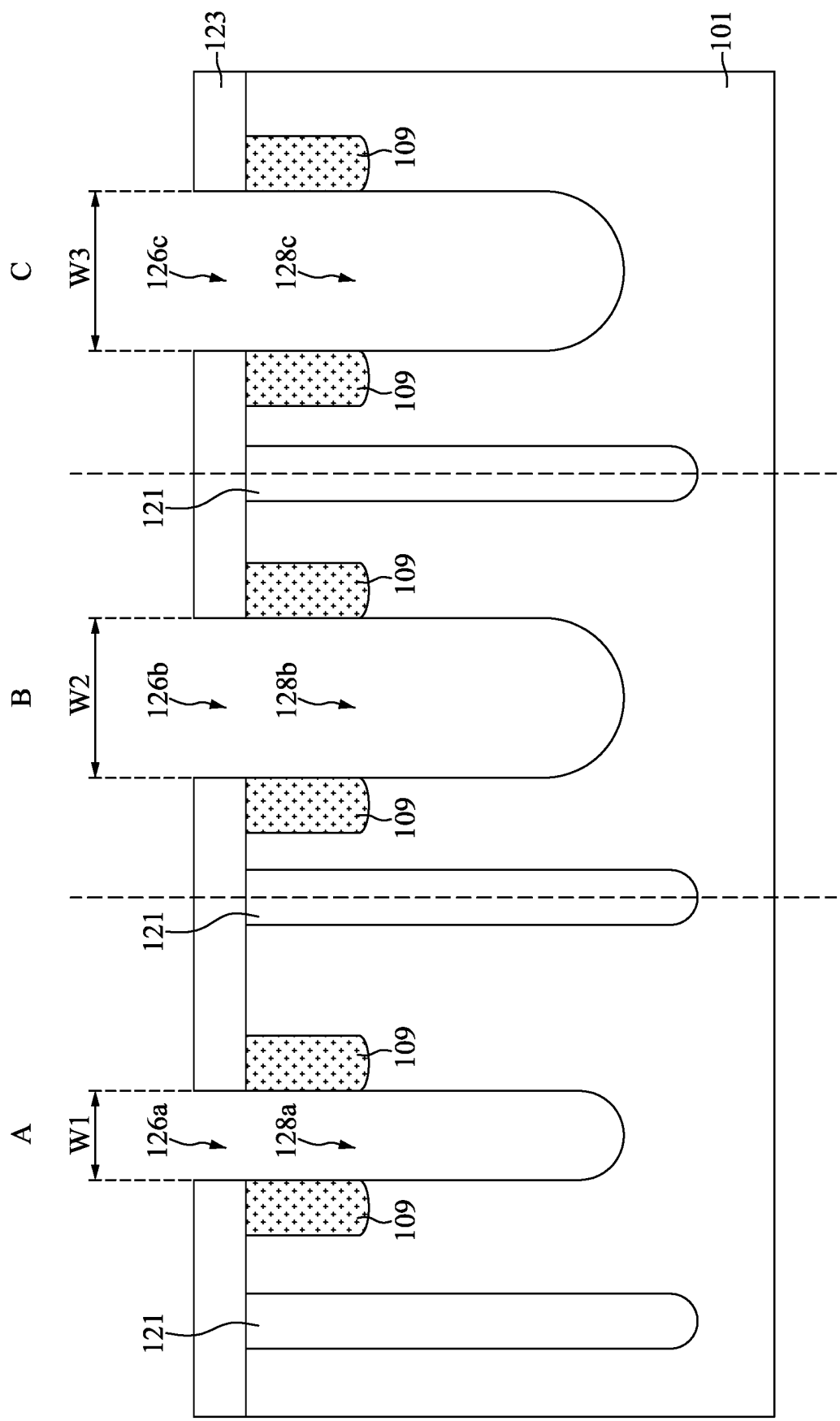
FIG. 9 is a cross-sectional view illustrating an intermediate stage of forming trenches in the semiconductor substrate during the formation of the semiconductor device, in accordance with some embodiments.

Subsequently, a patterned mask 123 with a plurality of openings 126a, 126b, and 126c is formed over the semiconductor substrate 101, and the patterned mask 123 is used in an etching process to form a plurality of trenches 128a, 128b, and 128c in the semiconductor substrate 101, as shown in FIG. 9 in accordance with some embodiments. In some embodiments, the semiconductor substrate 101 is partially exposed by the openings 126a, 126b, and 126c. In some embodiments, the patterned mask 123 and the semiconductor substrate 101 include different materials so that the etching selectivities may be different in the subsequent etching process.

In some embodiments, the opening 126a is in the first device region A and between the source/drain regions 109, the opening 126b is in the second device region B and between the source/drain regions 109, and the opening 126c is in the third device region C and between the source/drain regions 109. In addition, the trench 128a is also referred to as a first trench in the first device region A, the trench 128b is also referred to as a second trench in the second device region B, and the trench 128c is also referred to as a third trench in the third device region C.

In some embodiments, the first trench 128a has a width W1, the second trench 128b has a width W2, and the third trench 128c has a width W3. In some embodiments, the width W2 and the width W3 are greater than the width W1. In some embodiments, the width W2 is substantially the same as the width W3. After the trenches 128a, 128b and 128c are formed, the patterned mask 123 can be removed. The respective step is illustrated as the step S15 in the method 10 shown in FIG. 2.

Figure 10:
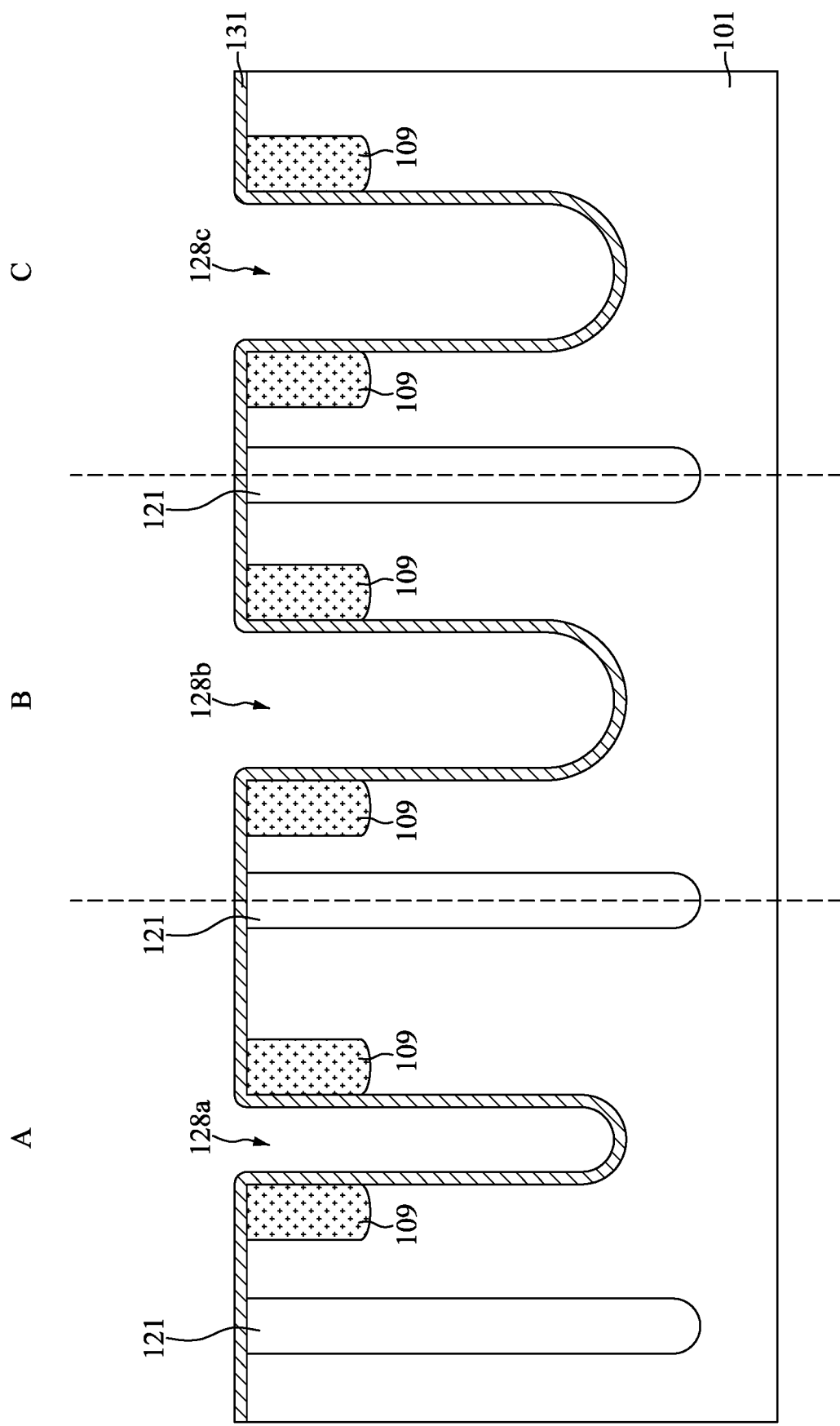
FIG. 10 is a cross-sectional view illustrating an intermediate stage of forming an interfacial material lining the trenches and over the semiconductor substrate during the formation of the semiconductor device, in accordance with some embodiments.

Then, an interfacial material 131 is formed over the semiconductor substrate 101 and lining the trenches 128a, 128b, and 128c, as shown in FIG. 10 in accordance with some embodiments. The respective step is illustrated as the step S17 in the method 10 shown in FIG. 2. In some embodiments, the interfacial material 131 is in direct contact with the inner surfaces of the trenches 128a, 128b, and 128c, and the top surfaces of the semiconductor substrate 101 and the isolation structures 109.

In some embodiments, the interfacial material 131 includes a dielectric material, such as silicon oxide ($SiO_2$), silicon oxynitride (SiON), or HfSiO. In some embodiments, the interfacial material 131 is formed by a deposition process, such as a CVD process, a PVD process, or an ALD process.

Figure 11:
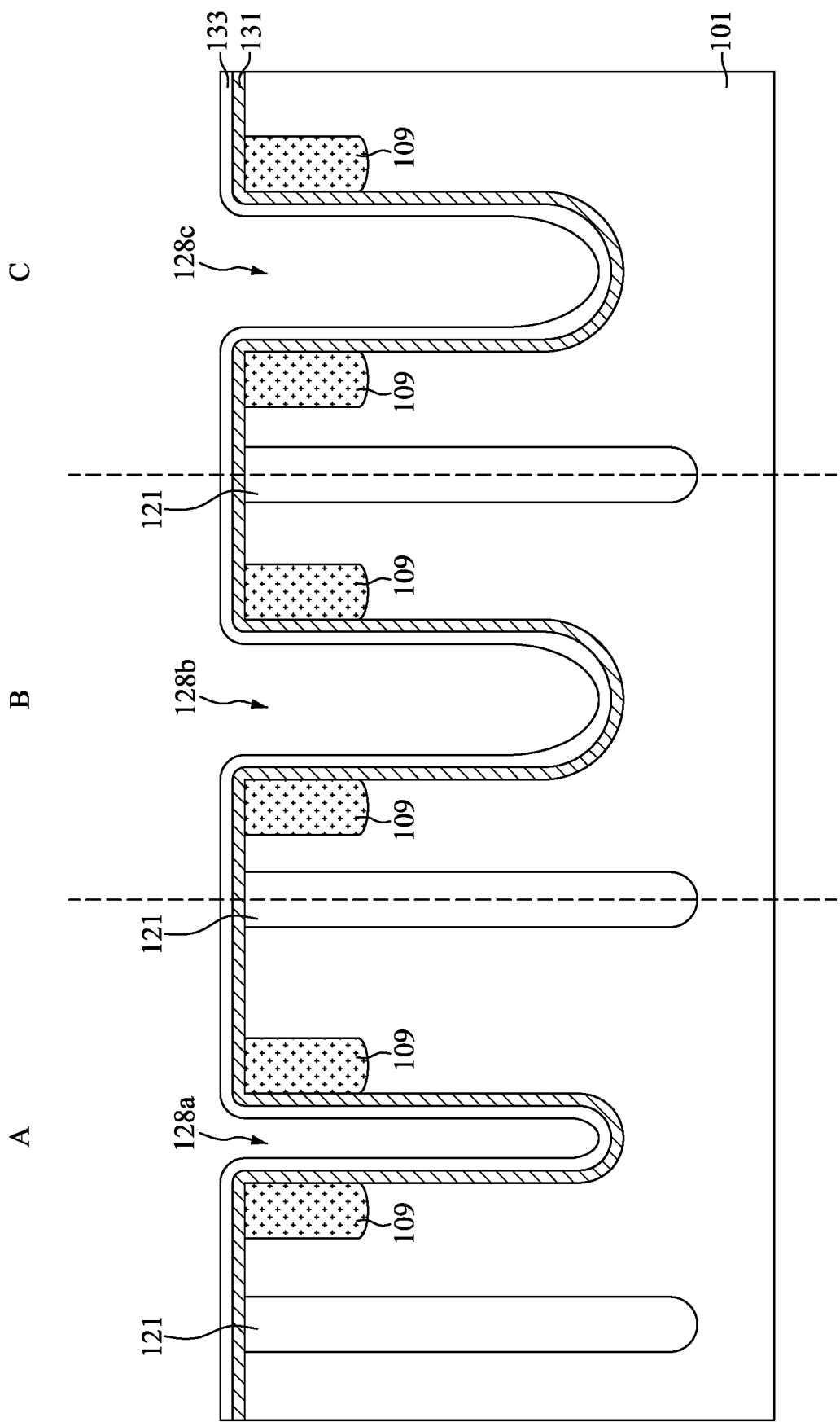
FIG. 11 is a cross-sectional view illustrating an intermediate stage of forming a gate dielectric material over the interfacial material during the formation of the semiconductor device, in accordance with some embodiments.

Next, a gate dielectric material 133 is formed over the interfacial material 131, as shown in FIG. 11 in accordance with some embodiments. The respective step is illustrated as the step S19 in the method 10 shown in FIG. 2. In some embodiments, the gate dielectric material 133 is formed lining the trenches 128a, 128b, 128c, and covering the interfacial material 133.

Moreover, the gate dielectric material 133 is separated from the semiconductor substrate 101, the source/drain regions 109, and the isolation structures 121 by the interfacial material 131, in accordance with some embodiments. In some embodiments, the gate dielectric material 133 includes silicon oxide, silicon nitride, silicon oxynitride, a dielectric material with high dielectric constant (high-k), or a combination thereof. In some embodiments, the gate dielectric material 133 is formed by a deposition process, such as a CVD process, a PVD process, or an ALD process.

Figure 12:
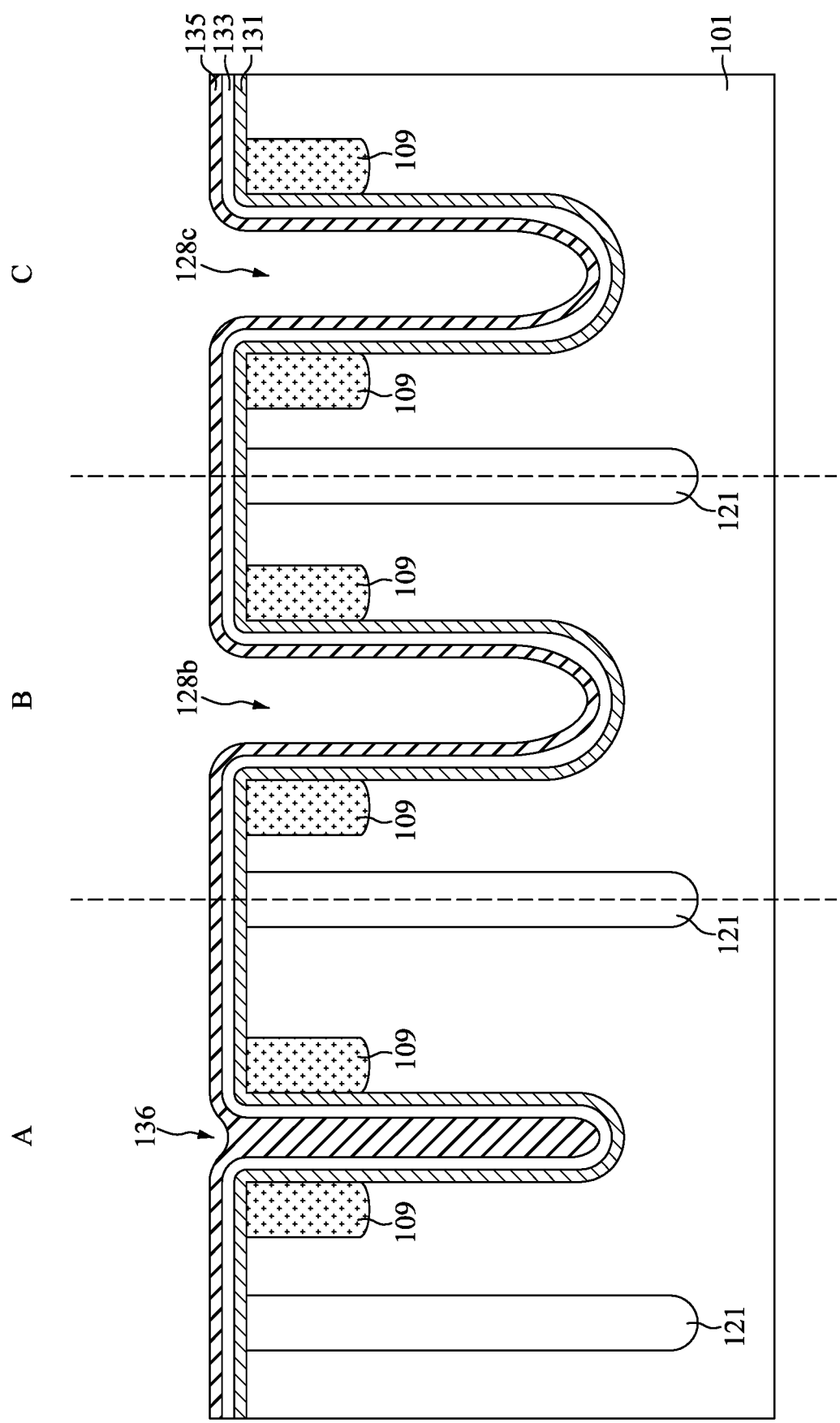
FIG. 12 is a cross-sectional view illustrating an intermediate stage of forming a work function metal material over the gate dielectric material during the formation of the semiconductor device, in accordance with some embodiments.

Subsequently, a work function metal material 135 is formed over the gate dielectric material 133, as shown in FIG. 12 in accordance with some embodiments. The respective step is illustrated as the step S21 in the method 10 shown in FIG. 2. In the present embodiment, since the width of the trench 128a is less than the widths of the trenches 128b and 128c (the width W1 is less than the widths W2 and W3, as shown in FIG. 9), the trench 128a is filled by the work function metal material 135, while the trenches 128b and 128c remain unfilled after the work function metal material 135 is formed.

In some embodiments, a recess 136 is formed over the portion of the work function metal material 135 filled in the trench 128a of the first device region A. In some embodiments, the work function metal material 135 includes N-work-function metal or P-work-function metal, depending on design requirements of the semiconductor device 100.

The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof. In some embodiments, the work function metal material 135 is formed by a deposition process, such as a CVD process, a PVD process, an ALD process, a sputtering process, a molecular beam epitaxy (MBE) process, a metal organic CVD (MOCVD), or another applicable process.

Figure 13:
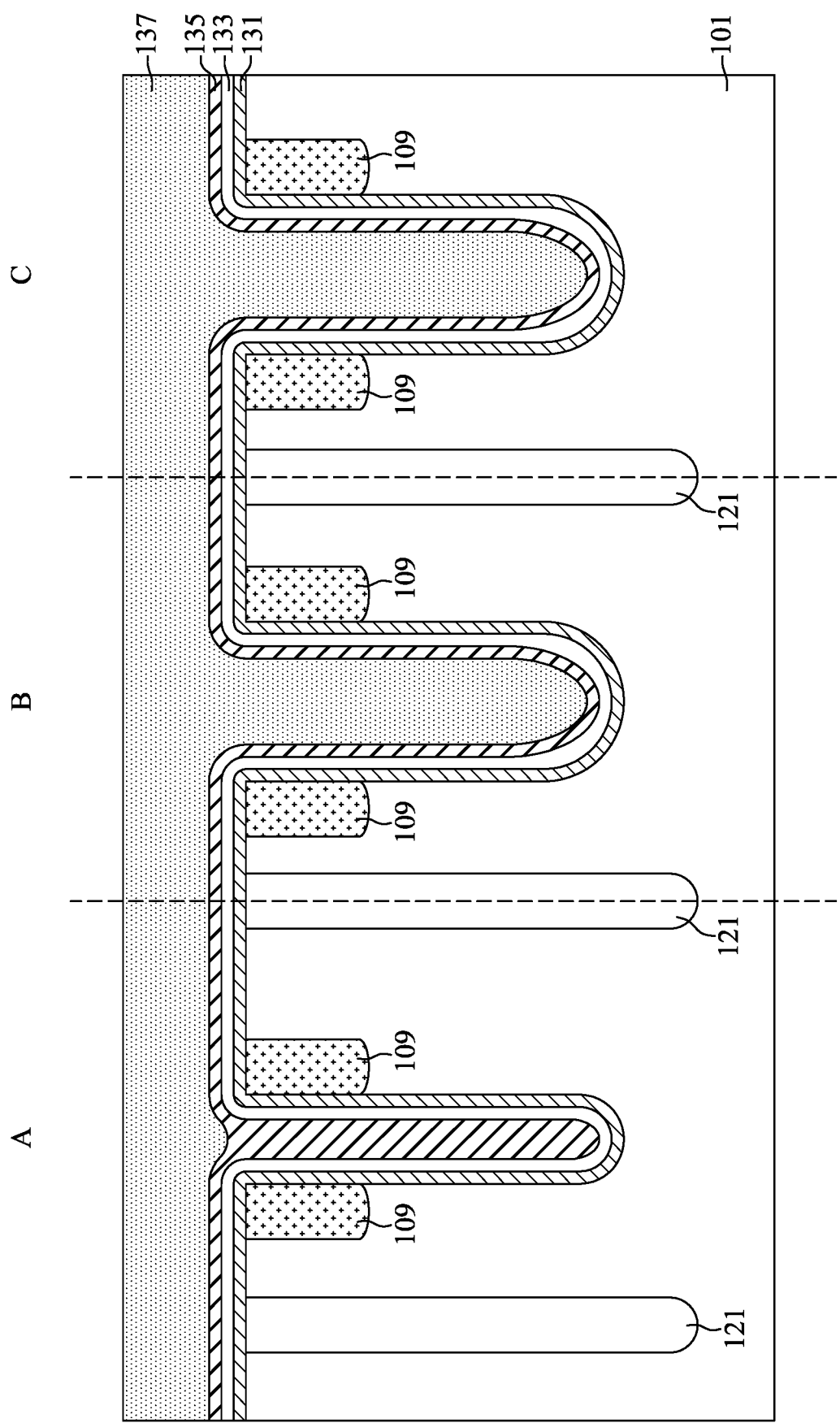
FIG. 13 is a cross-sectional view illustrating an intermediate stage of forming a sacrificial material over the work function metal material during the formation of the semiconductor device, in accordance with some embodiments.

Then, a sacrificial material 137 is formed over the work function metal material 135, as shown in FIG. 13 in accordance with some embodiments. In some embodiments, the recess 136 and the remaining portions of the trenches 128b and 128c are filled by the sacrificial material 137. The respective step is illustrated as the step S23 in the method 10 shown in FIG. 2. In some embodiments, the sacrificial material 137 includes a dielectric material, such as silicon oxide, silicon nitride, and silicon oxynitride. In some embodiments, the sacrificial material 137 is formed by a deposition process, such as a CVD process, a PVD process, or an ALD process.

Figure 14:
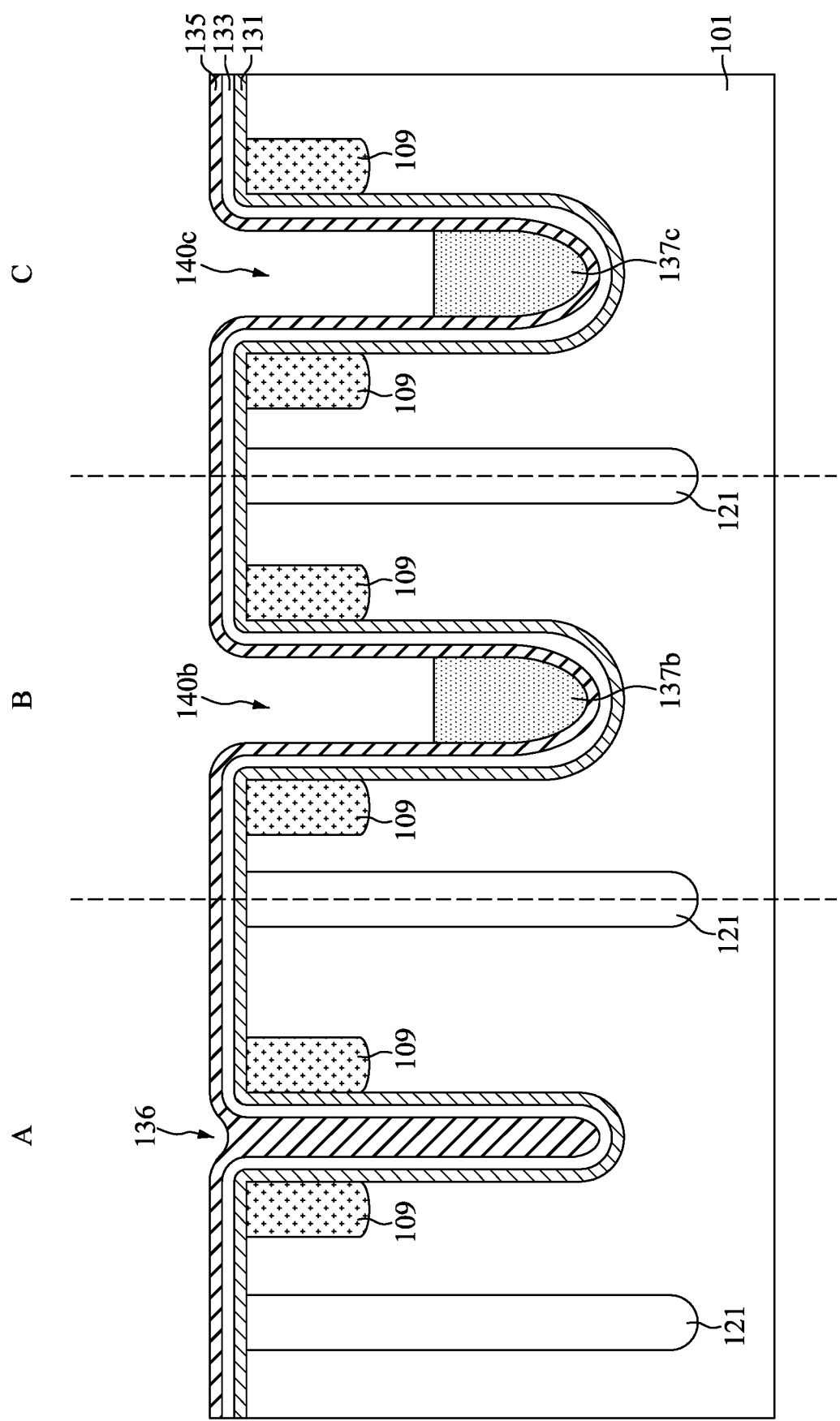
FIG. 14 is a cross-sectional view illustrating an intermediate stage of etching the sacrificial material to form sacrificial layers in the trenches during the formation of the semiconductor device, in accordance with some embodiments.

Next, an etching process is performed on the sacrificial material 137 to form a plurality of sacrificial layers 137b and 137c, as shown in FIG. 14 in accordance with some embodiments. The respective step is illustrated as the step S25 in the method 10 shown in FIG. 2. In some embodiments, the portion of the sacrificial material 137 in the first device region A is removed, and the portions of the sacrificial material 137 in the second device region B and the third device region C are partially removed such that sacrificial layers 137b and 137c remain in the second device region B and the third device region C, respectively.

In some embodiments, a recess 140b is formed over the sacrificial layer 137b, and a recess 140c is formed over the sacrificial layer 137c. In some embodiments, the etching process includes a wet etching process, a dry etching process, or a combination thereof. After the etching process is performed, the work function metal material 135 is partially exposed.

Figure 15:
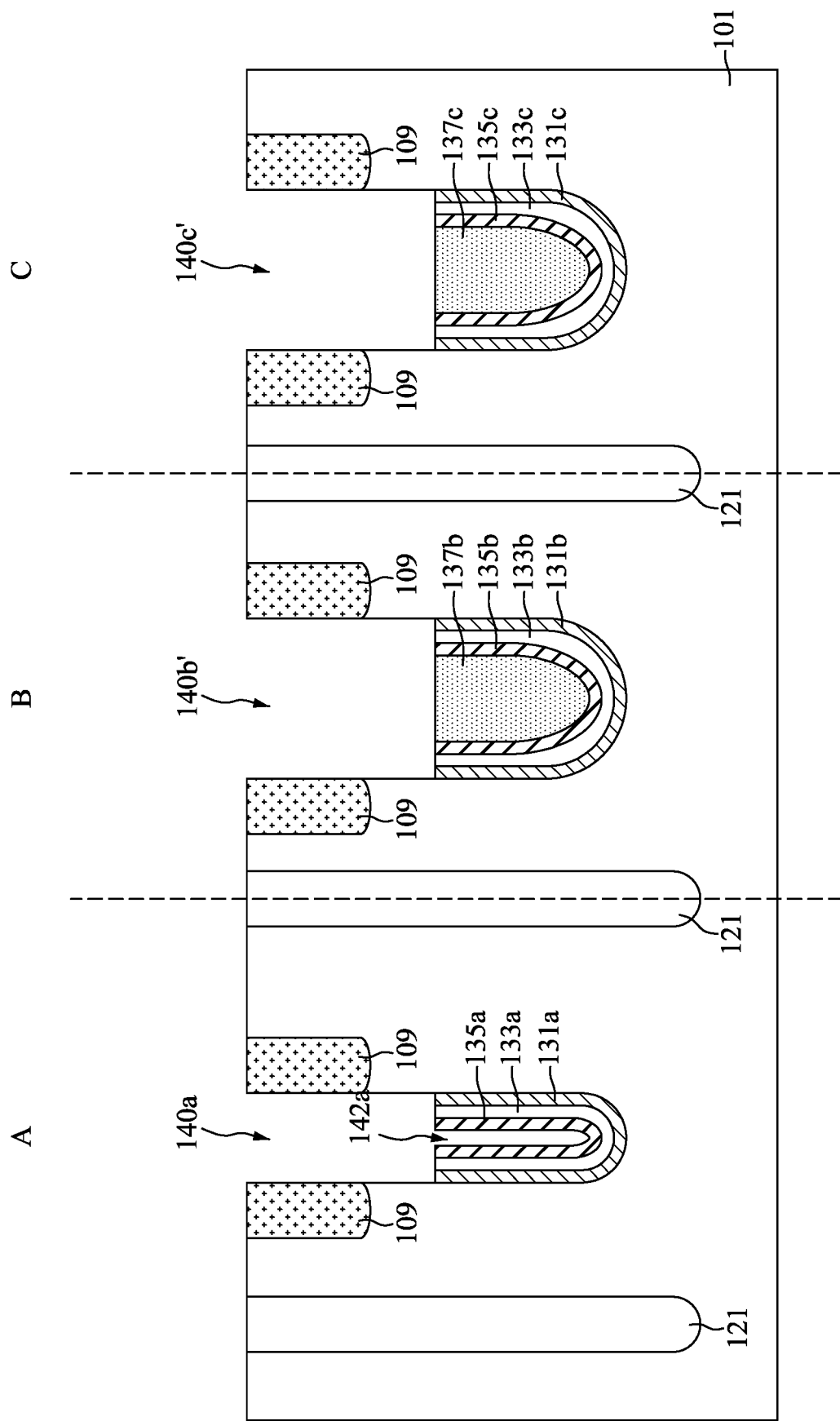
FIG. 15 is a cross-sectional view illustrating an intermediate stage of etching the work function metal material, the gate dielectric material, and the interfacial material using the sacrificial layers as an etch stop during the formation of the semiconductor device, in accordance with some embodiments.

Substantially, an etching process is performed on the work function metal material 135, the gate dielectric material 133, and the interfacial material 131, and the sacrificial layers 137b and 137c act as an etch stop layer to limit the etching process, as shown in FIG. 15 in accordance with some embodiments. After the etching process, a plurality of interfacial layers 131a, 131b, and 131c, a plurality of gate dielectric layers 133a, 133b, and 133c, and a plurality of work function metal layers 135a, 135b, and 135c are obtained. The respective step is illustrated as the step S27 in the method 10 shown in FIG. 2.

In some embodiments, recesses 140a and 142a are formed in the first device region A. The recess 140a is also referred to as an upper recess, and the recess 142a is also referred to as a lower recess. In some embodiments, the recess 140a has a width greater than that of the recess 142a. In some embodiments, the recess 140a is over the interfacial layer 131a, the gate dielectric layer 133a, and the work function metal layer 135a, and the recess 142a is surrounded by the work function metal layer 135a.

Moreover, the recesses 140b and 140c in the second device region B and the third device region C are enlarged such that recesses 140b' and 140c' are obtained. In some embodiments, the recess 140b' is over the interfacial layer 131b, the gate dielectric layer 133b, the work function metal layer 135b, and the sacrificial layer 137b. In some embodiments, the recess 140c' is over the interfacial layer 131c, the gate dielectric layer 133c, the work function metal layer 135c, and the sacrificial layer 137c. In addition, the etching process may include a wet etching process, a dry etching process, or a combination thereof.

Figure 16:
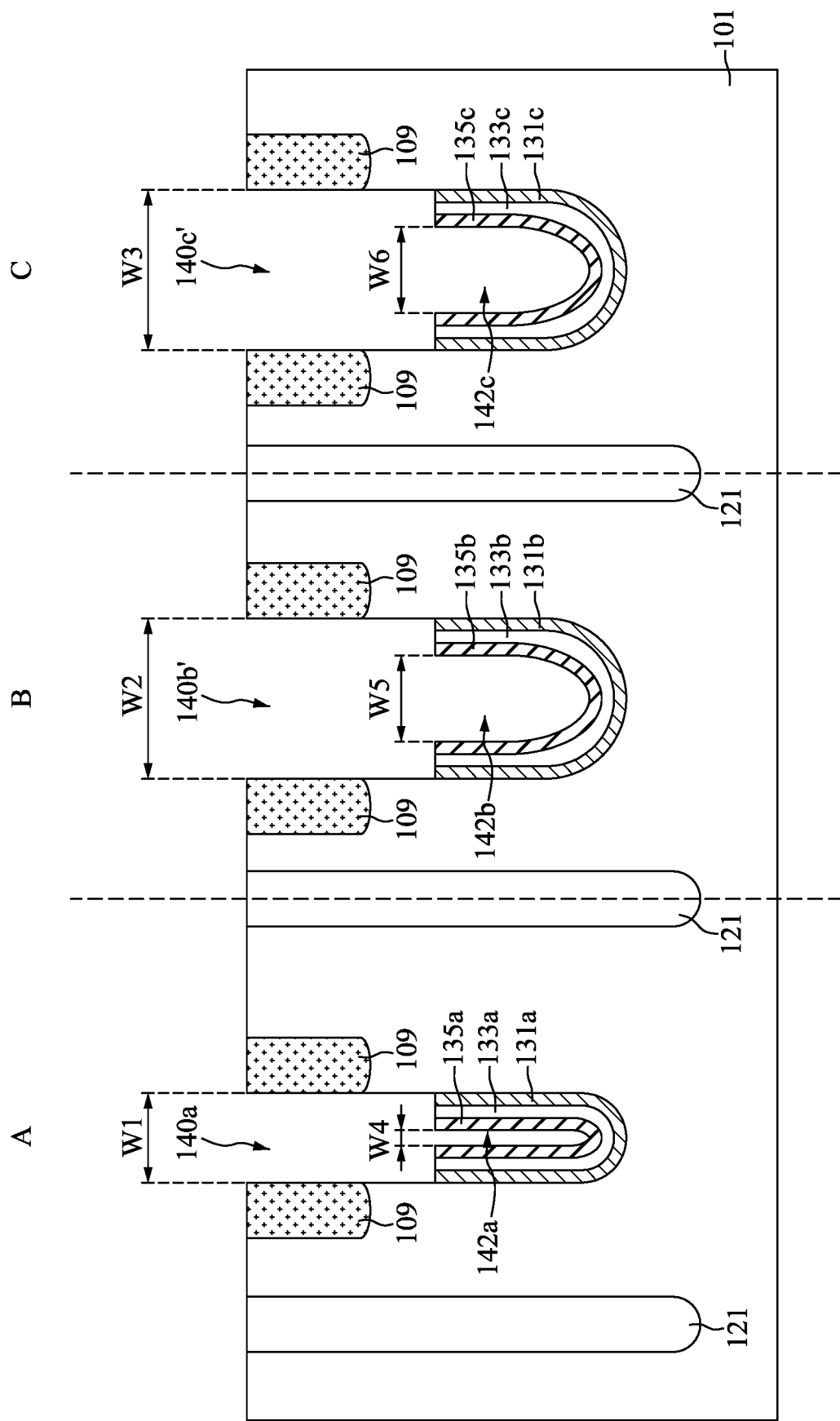
FIG. 16 is a cross-sectional view illustrating an intermediate stage of removing the sacrificial layers during the formation of the semiconductor device, in accordance with some embodiments.

After the interfacial layers 131a, 131b, 131c, the gate dielectric layers 133a, 133b, 133c, and the work function metal layers 135a, 135b, 135c are formed, the sacrificial layers 137b and 137c are removed such that recesses 142b and 142c are obtained, as shown in FIG. 16 in accordance with some embodiments. The respective step is illustrated as the step S29 in the method 10 shown in FIG. 3. In some embodiments, the sacrificial layers 137b and 137c are removed by a wet etching process, a dry etching process, a combination thereof, or another suitable removing process.

In some embodiments, the recess 142b is in the second device region B, and the recess 142c is in the third device region C. As mentioned above, the (upper) recess 140a has a width W1, the (lower) recess 142a has a width W4, and the width W1 is greater than the width W4, as shown in FIG. 16 in accordance with some embodiments. The recess 140b' is also referred to as an upper recess, and the recess 142b is also referred to as a lower recess. In some embodiments, the recess 140b' has a width greater than that of the recess 142b. For example, the width W2 of the recess 140b' is greater than the width W5 of the recess 142b. In addition, the recess 140c' is also referred to as an upper recess, and the recess 142c is also referred to as a lower recess. In some embodiments, the recess 140c' has a width greater than that of the recess 142c. For example, the width W3 of the recess 140c' is greater than the width W6 of the recess 142c. In addition, the width W5 of the recess 142b is substantially the same as the width W6 of the recess 142c, and the widths W5 and W6 are greater than the widths W4 of the recess 142a, in accordance with some embodiments.

Figure 17:
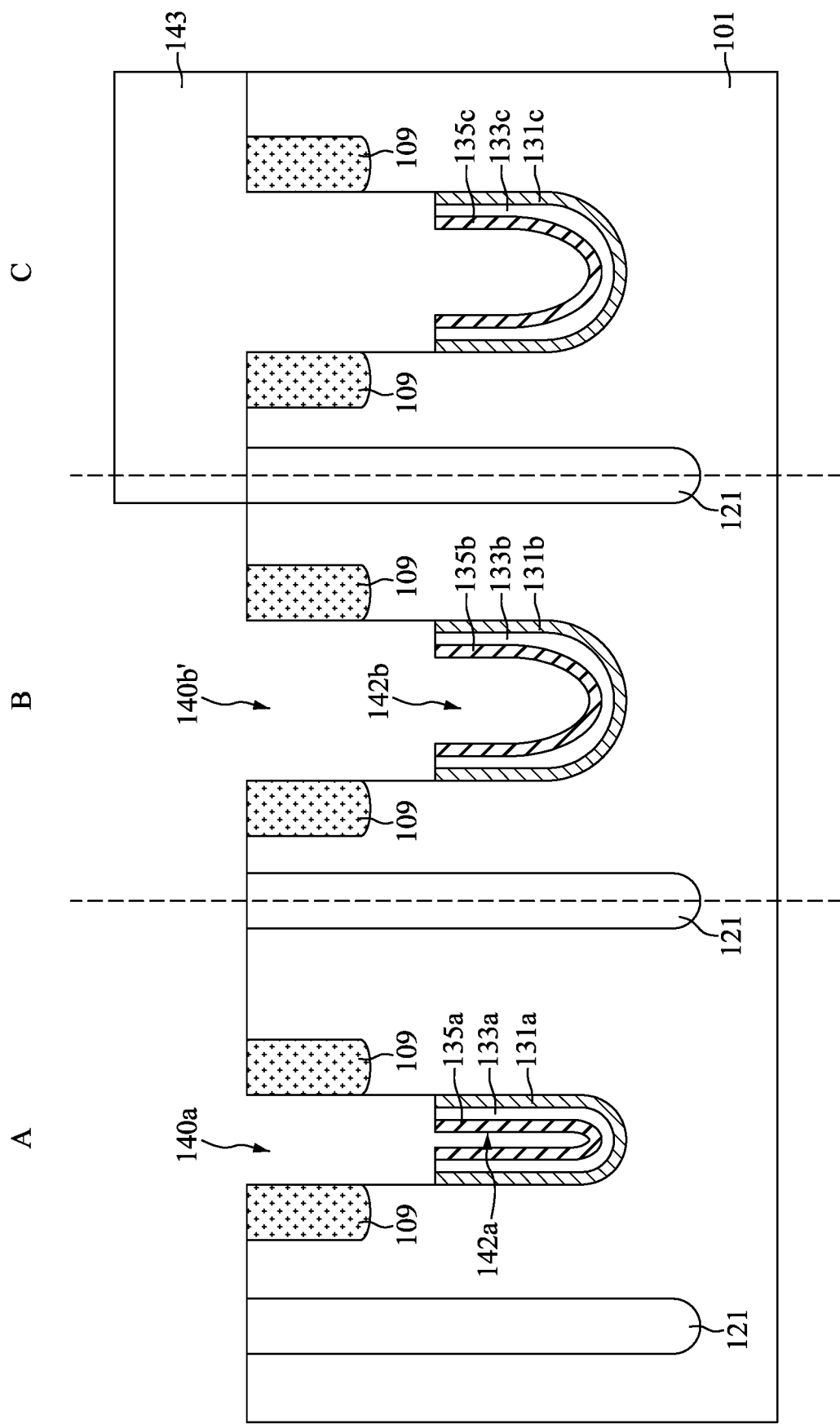
FIG. 17 is a cross-sectional view illustrating an intermediate stage of forming a patterned mask covering a device region during the formation of the semiconductor device, in accordance with some embodiments.

Then, a patterned mask 143 is formed covering the third device region C, as shown in FIG. 17 in accordance with some embodiments. In some embodiments, the source/drain regions 109, the interfacial layer 131c, the gate dielectric layer 133c, and the work function metal layer 135c in the third device region C are covered by the patterned mask 143 while the structures in the first device region A and the second device region B (including the interfacial layers 131a, 131b, the gate dielectric layers 133a, 133b, and the work function metal layers 135a, 135b) are exposed.

Figure 18:
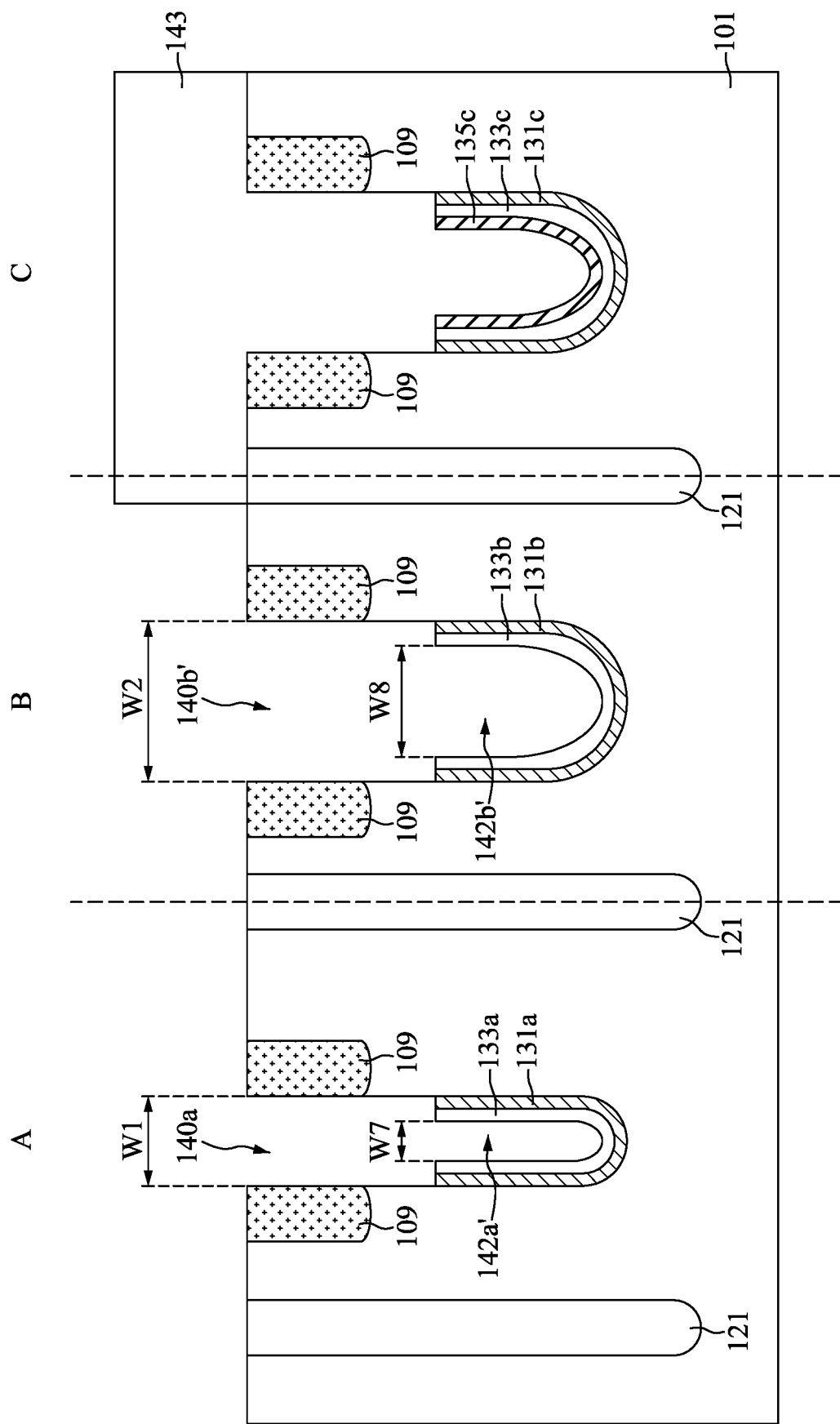
FIG. 18 is a cross-sectional view illustrating an intermediate stage of removing the remaining portions of the work function metal material exposed by the patterned mask during the formation of the semiconductor device, in accordance with some embodiments.

Next, the work function metal layers 135a and 135b in the first device region A and the second device region B are removed, as shown in FIG. 18 in accordance with some embodiments. The respective step is illustrated as the step S31 in the method 10 shown in FIG. 3. In some embodiments, the work function metal layers 135a and 135b in the first device region A and the second device region B are removed by an etching process, while the third device region C is protected by the patterned mask 143. The etching process may include a wet etching process, a dry etching process, or a combination thereof.

In some embodiments, after the etching process is performed, the gate dielectric layers 133a and 133b are exposed in the enlarged lower recesses 142a' and 142b'. The recess 142a' has a width W7, and the recess 142b' has a width W8. In some embodiments, the width W8 is greater than the width W7. After the work function metal layers 135a and 135b are removed, the patterned mask 143 may be removed. In some embodiments, the patterned mask 143 is removed by a stripping process, an ashing process, an etching process, or another suitable process.

Figure 19:
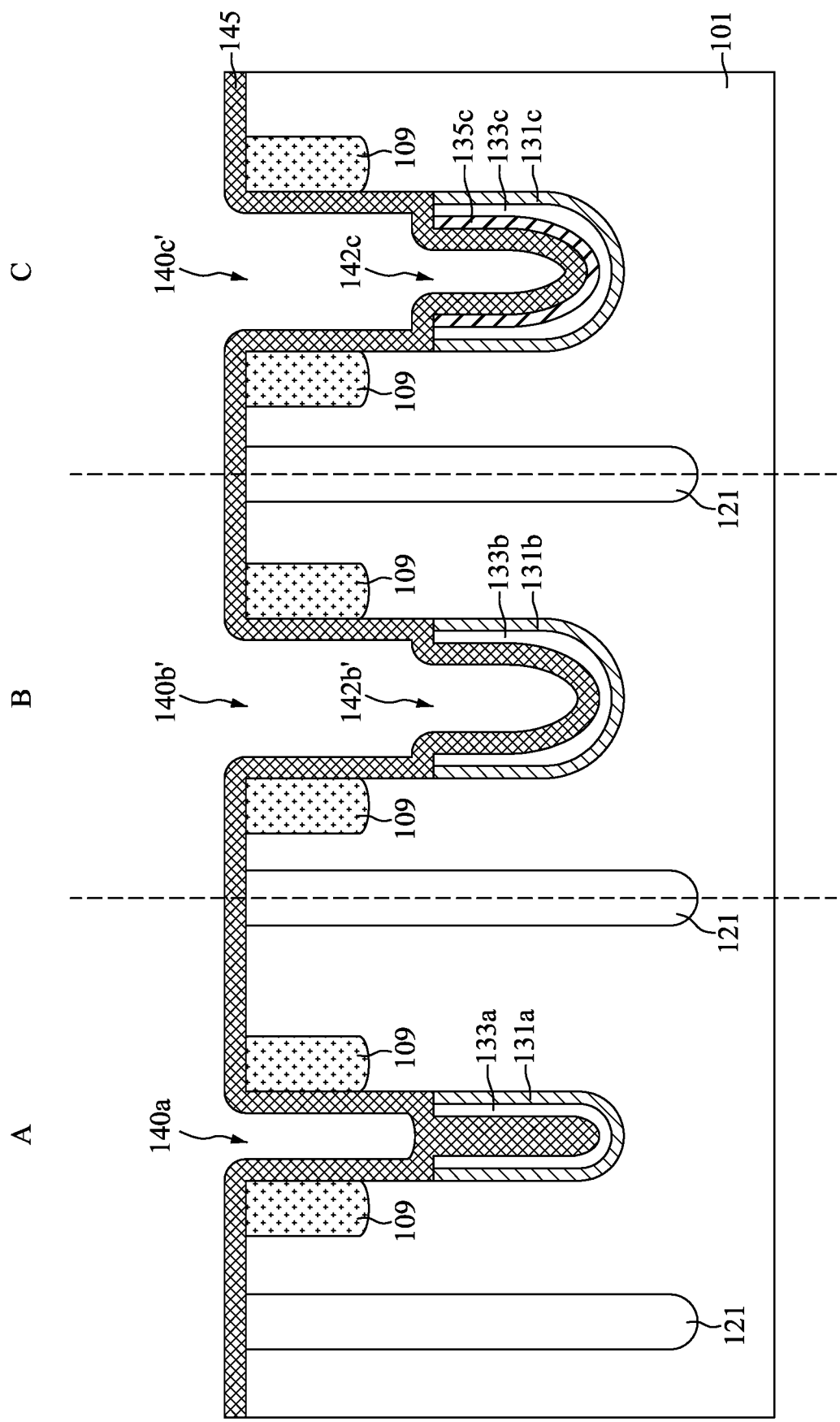
FIG. 19 is a cross-sectional view illustrating an intermediate stage of depositing a lower semiconductor material over the semiconductor substrate and covering the gate dielectric layers during the formation of the semiconductor device, in accordance with some embodiments.

Substantially, a lower semiconductor material 145 is conformally deposited over the structure, as shown in FIG. 19 in accordance with some embodiments. In some embodiments, the semiconductor substrate 101 is covered by the lower semiconductor material 145, and the lower semiconductor material 145 extends into the recesses in the first device region A, the second device region B, and the third device region C. The respective step is illustrated as the step S33 in the method 10 shown in FIG. 3.

In some embodiments, since the width W7 of the lower recess 142a' in the first device region A is less than the widths W8 of the lower recess 142b' in the second device region B (see FIG. 18), the lower recess 142a' is filled by the lower semiconductor material 145 while the lower recess 142b' remains unfilled after the lower semiconductor material 145 is deposited. Similar to the second device region B, in the third device region C, a lower recess 142c below the upper recess 140c' is obtained after the lower semiconductor material 145 is deposited. In some embodiments, the lower semiconductor material 145 includes polysilicon or silicon germanium (SiGe). In some embodiments, the lower semiconductor material 145 is formed by a deposition process, such as a CVD process, a PVD process, or an ALD process.

Figure 20:
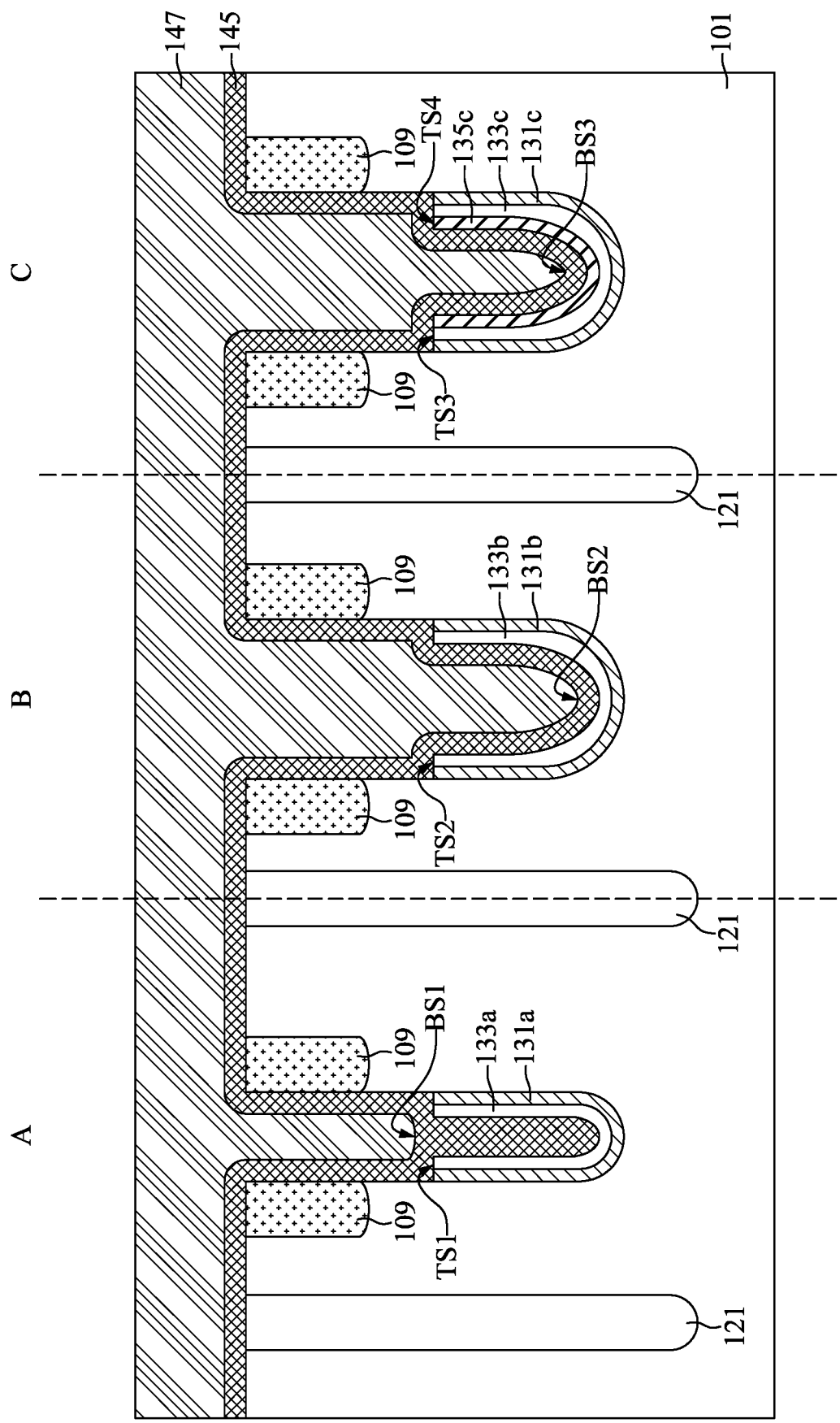
FIG. 20 is a cross-sectional view illustrating an intermediate stage of forming a sacrificial material over the lower semiconductor material during the formation of the semiconductor device, in accordance with some embodiments.

Then, a sacrificial material 147 is formed over the lower semiconductor material 145, as shown in FIG. 20 in accordance with some embodiments. In some embodiments, the remaining recesses in the first device region A, the second device region B, and the third device region C, such as the upper recess 140a, 130b', 140c' and the lower recesses 142b', 142c, are filled by the sacrificial material 147. The respective step is illustrated as the step S35 in the method 10 shown in FIG. 3.

In the first device region A, the top surface TS1 of the gate dielectric layer 133a is covered by and in direct contact with the lower semiconductor material 145, and the bottom surface BS1 of the sacrificial material 147 is higher than the top surface TS1 of the gate dielectric layer 133a, in accordance with some embodiments. In the second device region B, the top surface TS2 of the gate dielectric layer 133b is covered by and in direct contact with the lower semiconductor material 145, and the bottom surface BS2 of the sacrificial material 147 is lower than the top surface TS2 of the gate dielectric layer 133b, in accordance with some embodiments.

In the third device region C, the top surface TS3 of the gate dielectric layer 133c and the top surface TS4 of the work function metal layer 135c are covered by and in direct contact with the lower semiconductor material 145, and the bottom surface BS3 of the sacrificial material 147 is lower than the top surface TS3 of the gate dielectric layer 133c and the top surface TS4 of the work function metal layer 135c, in accordance with some embodiments. Some materials and processes used to form the sacrificial material 147 are similar to, or the same as, those used to form the sacrificial material 137, and details thereof are not repeated herein.

Figure 21:
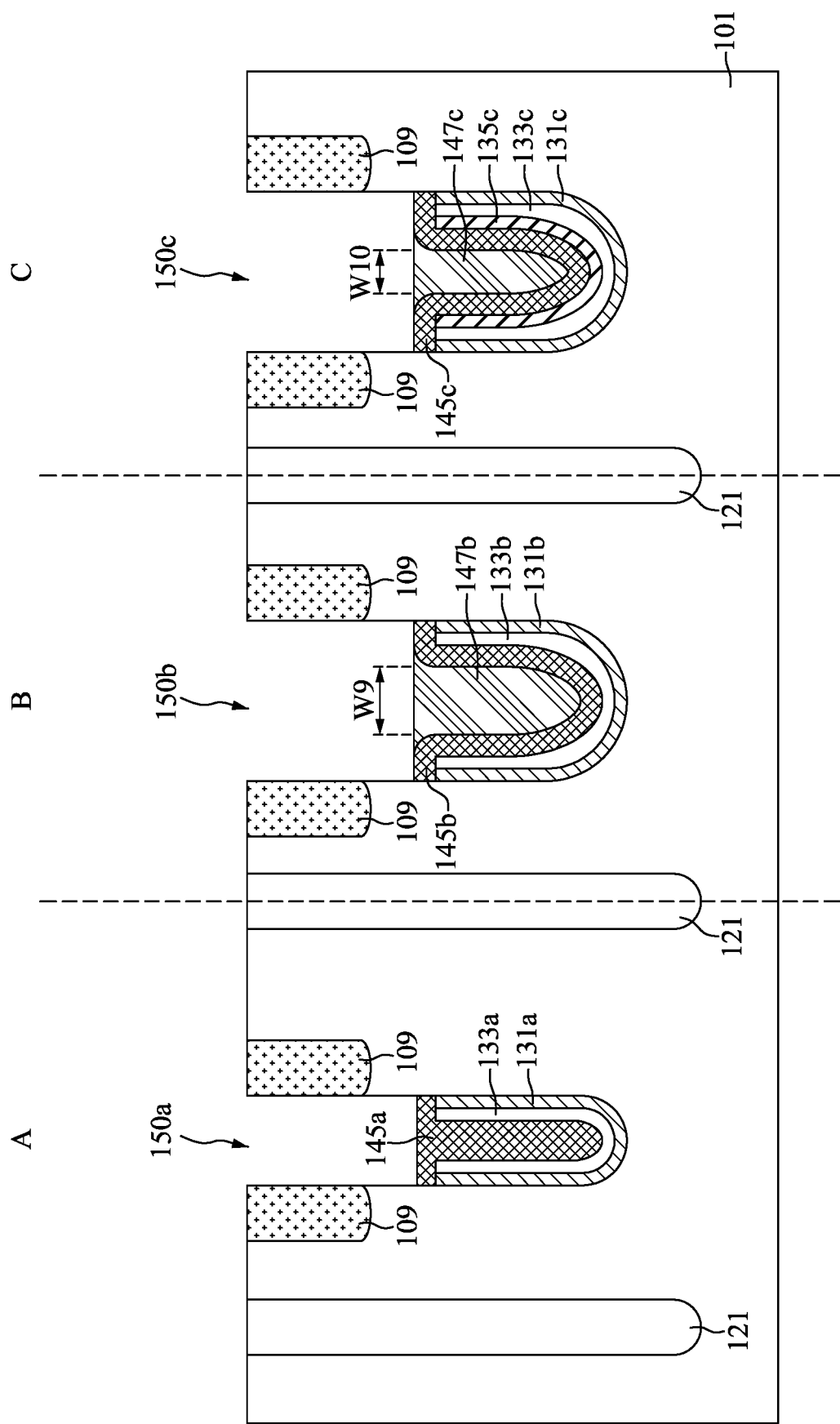
FIG. 21 is a cross-sectional view illustrating an intermediate stage of etching the lower semiconductor material and the sacrificial material to form lower semiconductor layers and sacrificial layers during the formation of the semiconductor device, in accordance with some embodiments.

Next, the sacrificial material 147 and the lower semiconductor material 145 are etched to form a plurality of sacrificial layers 147b, 147c and a plurality of lower semiconductor layers 145a, 145b, 145c, as shown in FIG. 21 in accordance with some embodiments. In some embodiments, the lower semiconductor layer 145a and a recess 150a over the lower semiconductor layer 145a are formed in the first device region A. In some embodiments, the lower semiconductor layer 145b, the sacrificial layer 147b, and a recess 150b over the lower semiconductor layer 145b and the sacrificial layer 147b are formed in the second device region B. In some embodiments, the lower semiconductor layer 145c, the sacrificial layer 147c, and a recess 150c over the lower semiconductor layer 145c and the sacrificial layer 147c are formed in the third device region C. The respective step is illustrated as the step S37 in the method 10 shown in FIG. 3.

In some embodiments, the sacrificial material 147 and the lower semiconductor material 145 are etched by a wet etching process, and the etching time of the wet etching process is controlled such that the openings 150a, 150b and 150c are obtained. In addition, the sacrificial layer 147b has a width W9, and the sacrificial layer 147c has a width W10. Since the structure in the third device region C includes the work function metal layer 135c, the width W10 is less than the width W9, in accordance with some embodiments.

Figure 22:
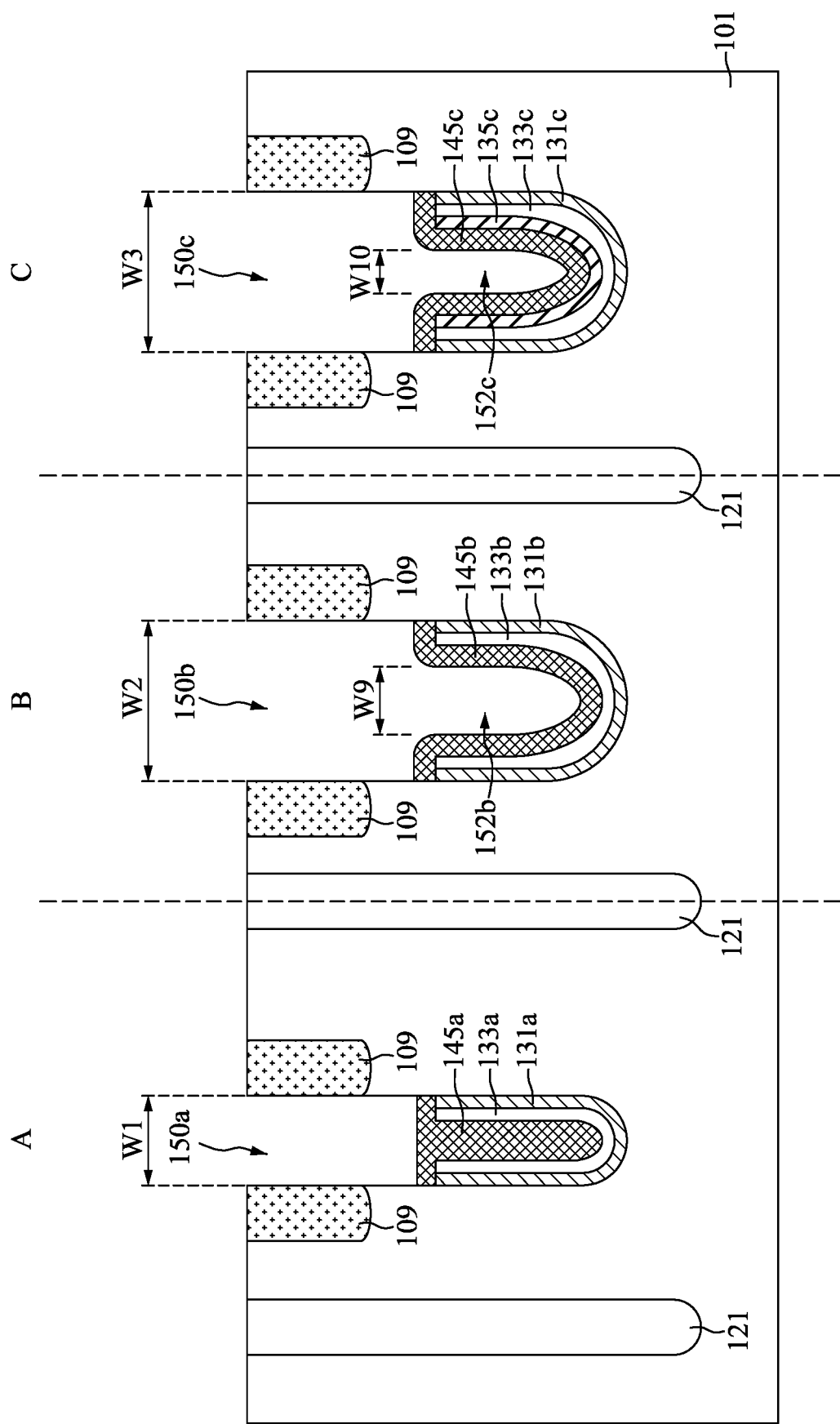
FIG. 22 is a cross-sectional view illustrating an intermediate stage of removing the sacrificial layers during the formation of the semiconductor device, in accordance with some embodiments.

After the lower semiconductor layers 145a, 145b and 145c are formed, the sacrificial layers 147b and 147c are removed such that recesses 152b and 152c are obtained, as shown in FIG. 22 in accordance with some embodiments. The respective step is illustrated as the step S39 in the method 10 shown in FIG. 3. In some embodiments, the recesses 152b and 152c are also referred to as lower recesses, and the recesses 150b and 150c are also referred to as upper recesses.

As mentioned above, the width W9 of the lower recess 152b is greater than the width W10 of the lower recess 152c, in accordance with some embodiments. In some embodiments, the sacrificial layers 147b and 147c are removed by a wet etching process, a dry etching process, a combination thereof, or another suitable removing process. In some embodiments, the lower semiconductor layer 145a in the first device region A has a T-shaped profile with a planar top surface, and the lower semiconductor layers 145b and 145c in the second device region B and the third device region C have U-shaped profiles with concave top surfaces.

Figure 23:
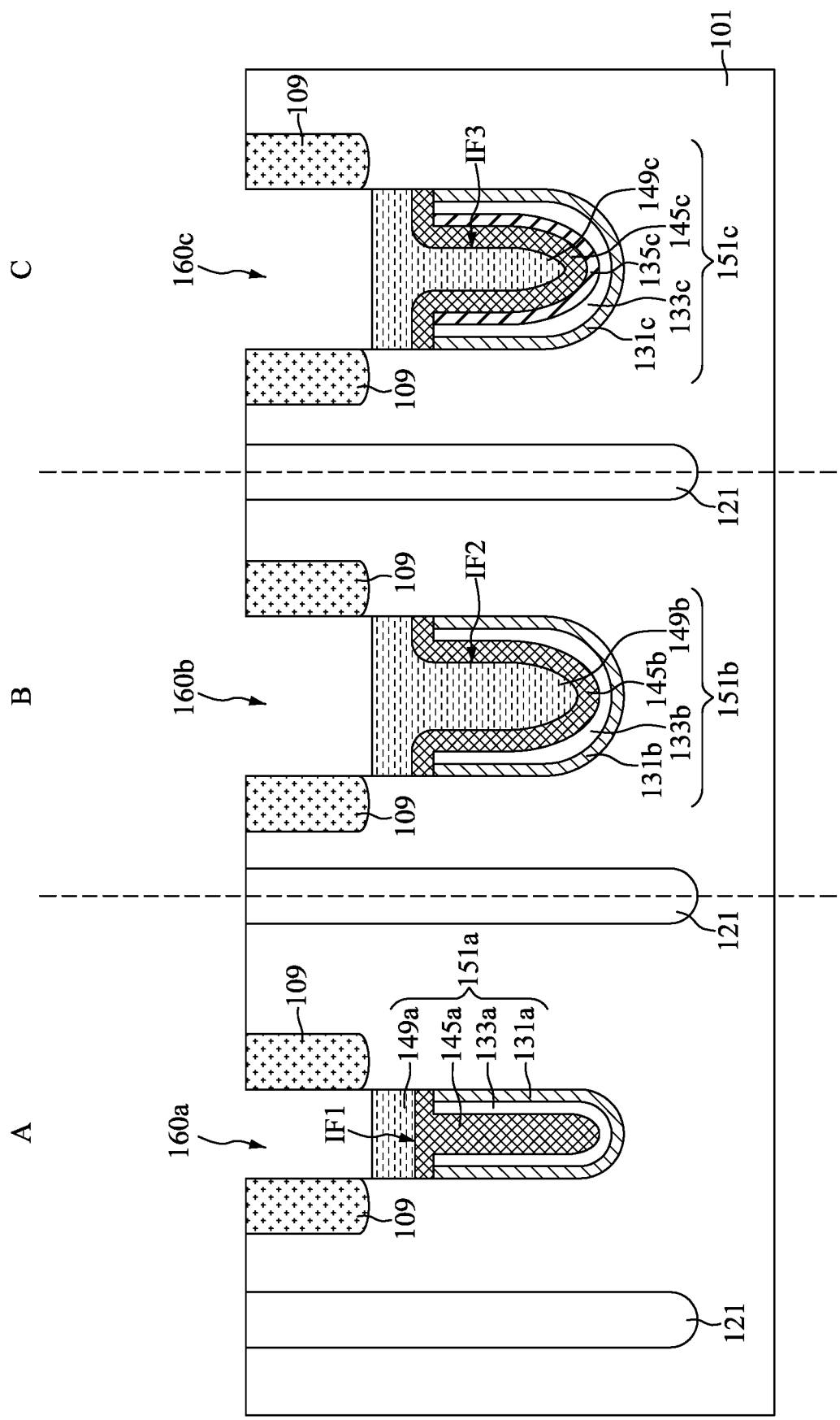
FIG. 23 is a cross-sectional view illustrating an intermediate stage of depositing upper semiconductor layers in the trenches and over the lower semiconductor layers during the formation of the semiconductor device, in accordance with some embodiments.

Subsequently, a plurality of upper semiconductor layers 149a, 149b and 149c are deposited over the lower semiconductor layers 145a, 145b and 145c, respectively, as shown in FIG. 23 in accordance with some embodiments. The respective step is illustrated as the step S41 in the method 10 shown in FIG. 3. In some embodiments, the upper semiconductor layers 149a, 149b and 149c include germanium (Ge). In some embodiments, the deposition of the upper semiconductor layers 149a, 149b and 149c includes a CVD process, a PVD process, an ALD process, or another suitable deposition process.

In the first device region A, the upper semiconductor layer 149a is deposited in the recess 150a, and a recess 160a is obtained over the upper semiconductor layers 149a. In the second device region B, the lower recess 152b is filled by the upper semiconductor layers 149b, and the upper semiconductor layers 149b further occupied a portion of the upper recess 150b. In some embodiments, a recess 160b is obtained over the upper semiconductor layers 149b. In the third device region C, the lower recess 152c is filled by the upper semiconductor layers 149c, and the upper semiconductor layers 149c further occupied a portion of the upper recess 150c. In some embodiments, a recess 160c is obtained over the upper semiconductor layers 149c.

After the upper semiconductor layers 149a, 149b, and 149c are formed, a plurality of buried gate structures 151a, 151b, and 151c are obtained. In some embodiments, the buried gate structure 151a in the first device region A includes the interfacial layer 131a, the gate dielectric layer 133a, the lower semiconductor layer 145a, and the upper semiconductor layer 149a. In some embodiments, the buried gate structure 151b in the second device region B includes the interfacial layer 131b, the gate dielectric layer 133b, the lower semiconductor layer 145b, and the upper semiconductor layer 149b. In some embodiments, the buried gate structure 151c in the third device region C includes the interfacial layer 131c, the gate dielectric layer 133c, the work function metal layer 135c, the lower semiconductor layer 145c, and the upper semiconductor layer 149c.

Then, a plurality of isolation layers 163a, 163b, and 163c are formed in the recesses 160a, 160b, and 160c over the buried gate structures 151a, 151b, and 151c, as shown in FIG. 1 in accordance with some embodiments. The respective step is illustrated as the step S43 in the method 10 shown in FIG. 3. In some embodiments, the widths of the isolation layers 163b and 163c are greater than the width of the isolation layer 163a (e.g., the widths W2 and W3 are greater than the width W1).

In some embodiments, the isolation layers 163a, 163b, and 163c include a dielectric material, such as silicon oxide, silicon nitride, and silicon oxynitride. In some embodiments, the formation of the isolation layers 163a, 163b, and 163c includes a deposition process and a planarization process. The deposition process may include a CVD process, a PVD process, an ALD process, or a combination thereof. The planarization process may include a CMP process.

After the isolation layers 163a, 163b, and 163c are formed, the semiconductor device 100 is obtained. In some embodiments, the semiconductor device 100 is part of dynamic random access memory (DRAM), the buried gate structure 151a is in an n-type field effect transistor (NFET) of an array region, the buried gate structure 151b is in an n-type field effect transistor (NFET) of a peripheral circuit region, and the buried gate structure 151c is in a p-type field effect transistor (PFET) in the peripheral circuit region.

Figure 24:
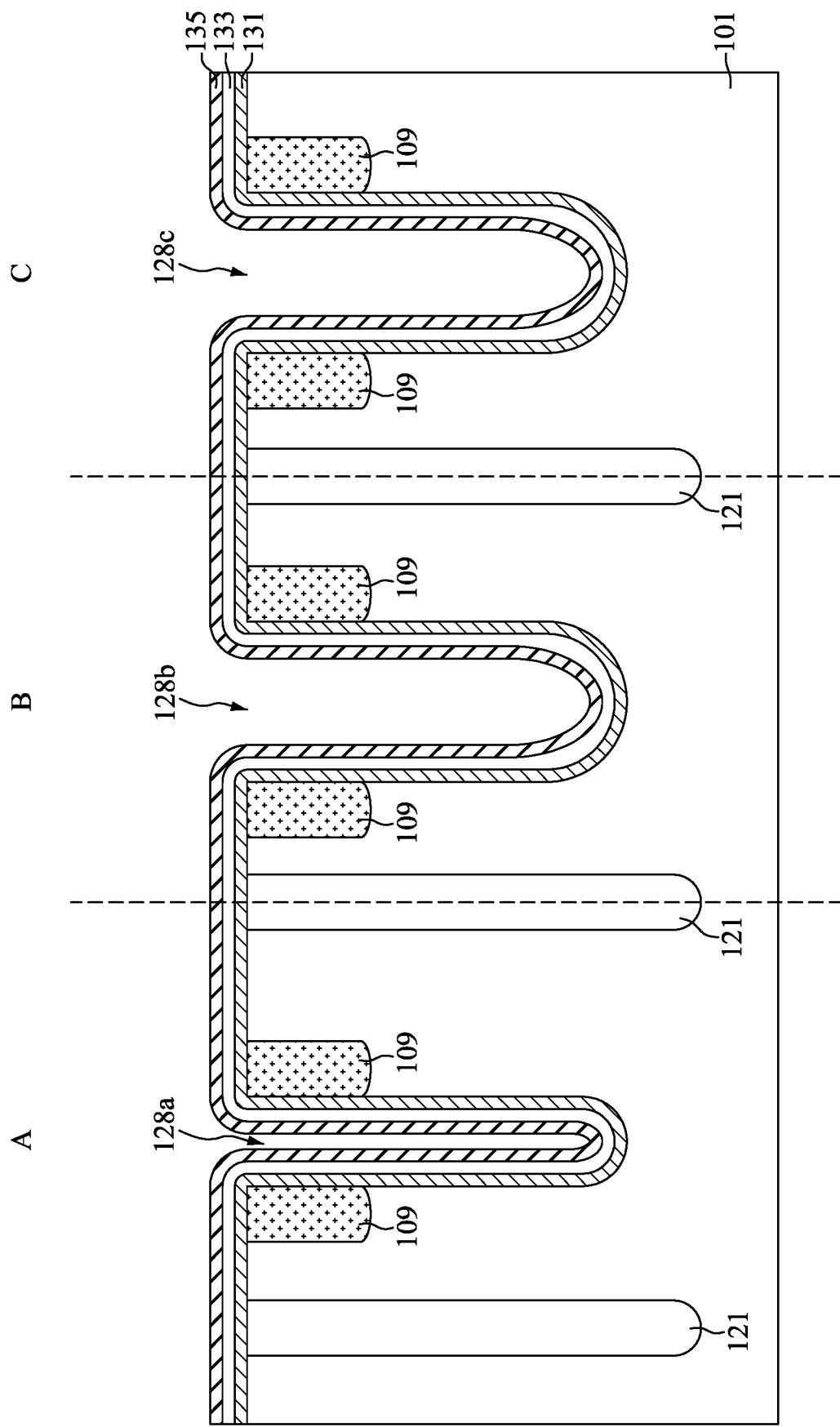
FIG. 24 is a cross-sectional view illustrating an intermediate stage of forming a work function metal material over the gate dielectric material during the formation of the semiconductor device, in accordance with some embodiments.

FIGS. 24-27 are cross-sectional views illustrating intermediate stages in the formation of the semiconductor device 100, in accordance with some other embodiments. It should be pointed out that operations for forming the semiconductor device 100 before the structure shown in FIG. 24 are substantially the same as the operations for forming the semiconductor device 100 shown in FIGS. 4-11, and the related detailed descriptions may refer to the foregoing paragraphs and are not discussed again herein.

After the gate dielectric material 133 is formed, a work function metal material 135 is formed over the gate dielectric material 133, as shown in FIG. 24 in accordance with some embodiments. In this embodiment, the trench 128a is not filled by the work function metal material 135. In this embodiment, the trenches 128a, 128b and 128c are not filled by the work function metal material 135. The work function metal material 135 has been described in detail in the aforementioned embodiment, so that details thereof are not repeated.

Figure 25:
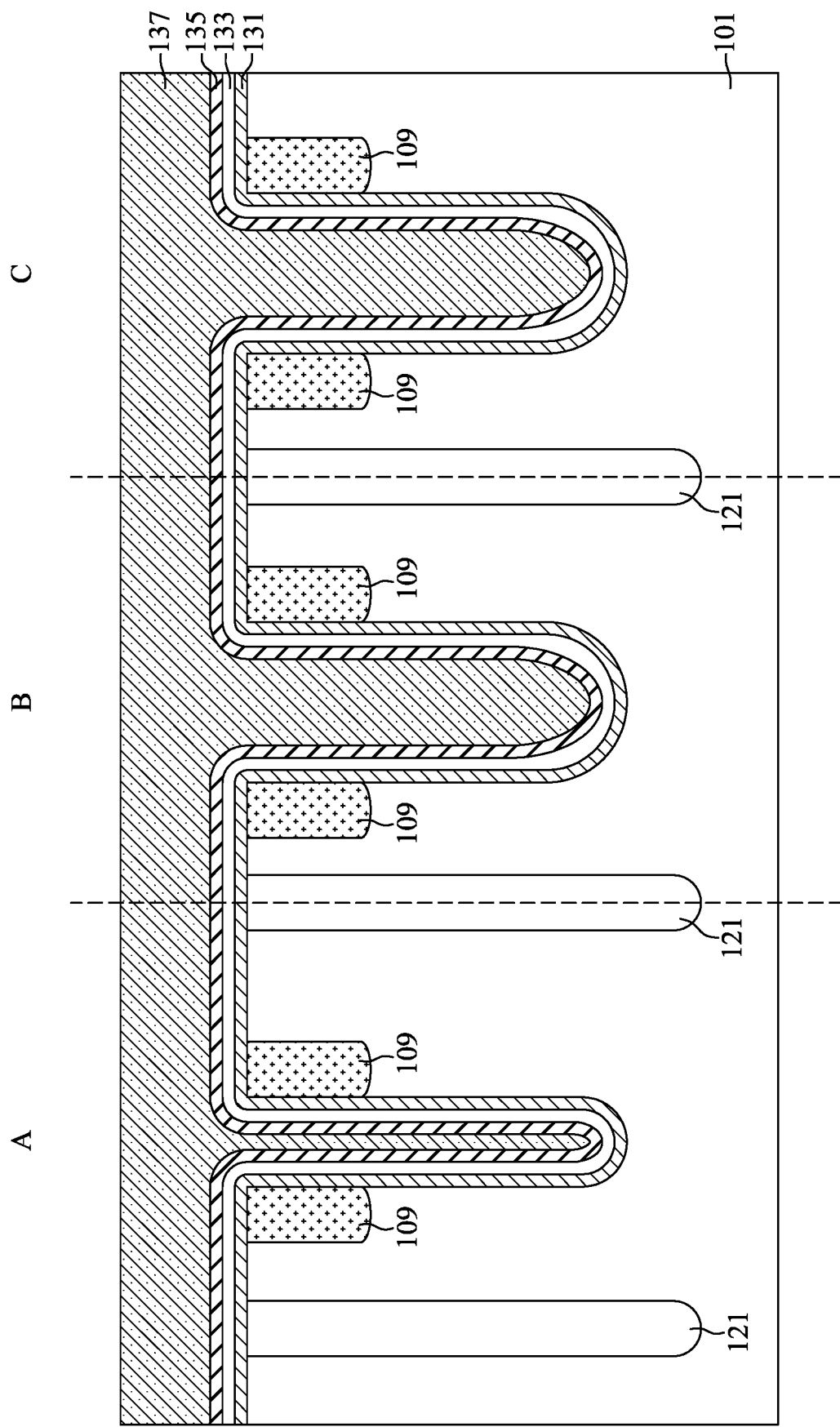
FIG. 25 is a cross-sectional view illustrating an intermediate stage of forming a sacrificial material over the work function metal material during the formation of the semiconductor device, in accordance with some embodiments.

Next, a sacrificial material 137 is formed over the work function metal material 135, as shown in FIG. 25 in accordance with some embodiments. In some embodiments, the remaining portions of the trenches 128a, 128b, and 128c are filled by the sacrificial material 137. The sacrificial material 137 has been described in detail in the aforementioned embodiment, so that details thereof are not repeated.

Figure 26:
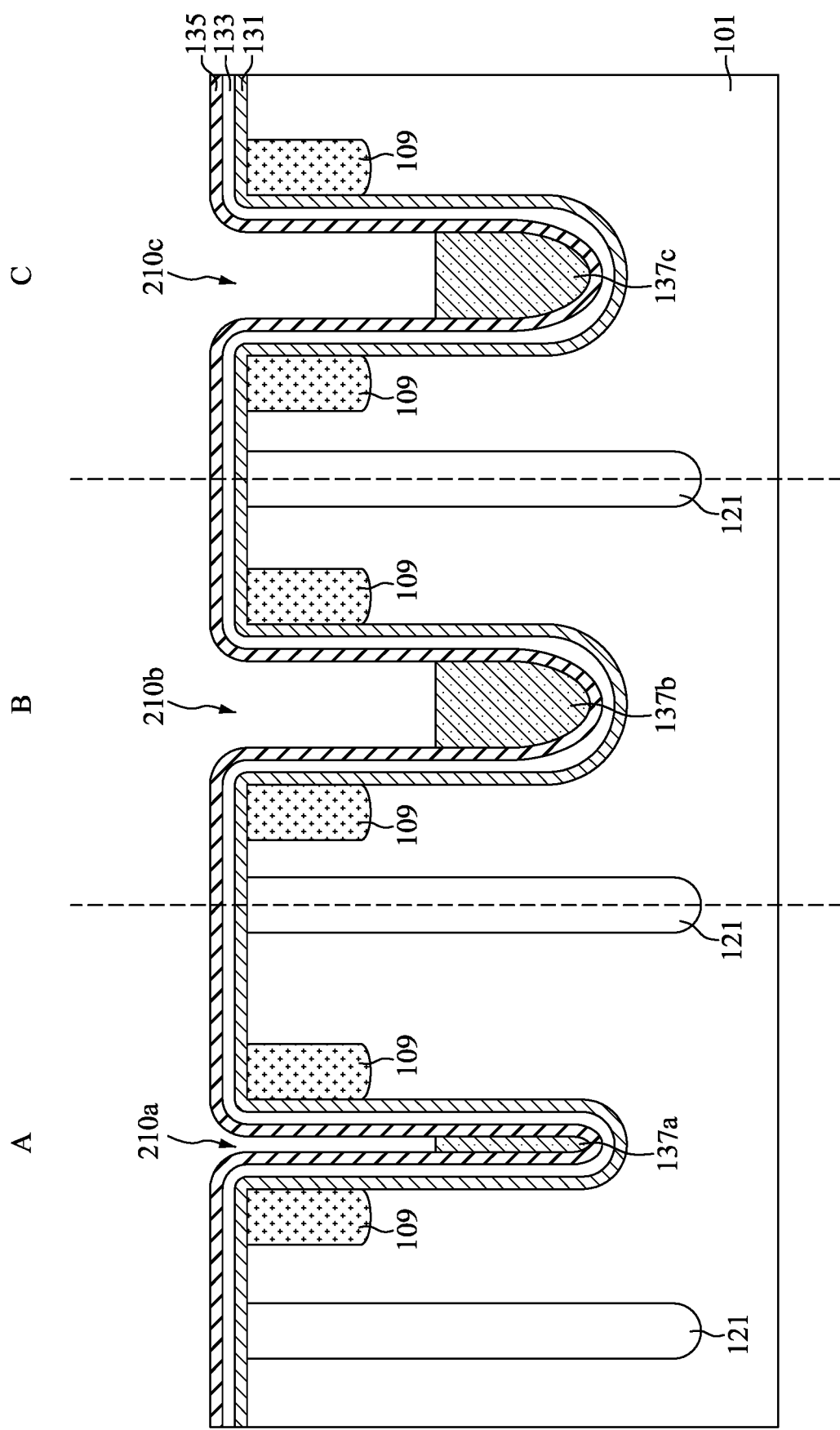
FIG. 26 is a cross-sectional view illustrating an intermediate stage of etching the sacrificial material to form sacrificial layers in the trenches during the formation of the semiconductor device, in accordance with some embodiments.

Subsequently, an etching process is performed on the sacrificial material 137 to form a plurality of sacrificial layers 137a, 137b and 137c, as shown in FIG. 26 in accordance with some embodiments. In some embodiments, the sacrificial layers 137a, 137b and 137c are the portions remain in the first device region A, the second device region B, and the third device region C, respectively. In some embodiments, a recess 210a is formed over the sacrificial layer 137a, a recess 210b is formed over the sacrificial layer 137b, and a recess 210c is formed over the sacrificial layer 137c. In some embodiments, the etching process includes a wet etching process, a dry etching process, or a combination thereof. After the etching process is performed, the work function metal material 135 is partially exposed.

Figure 27:
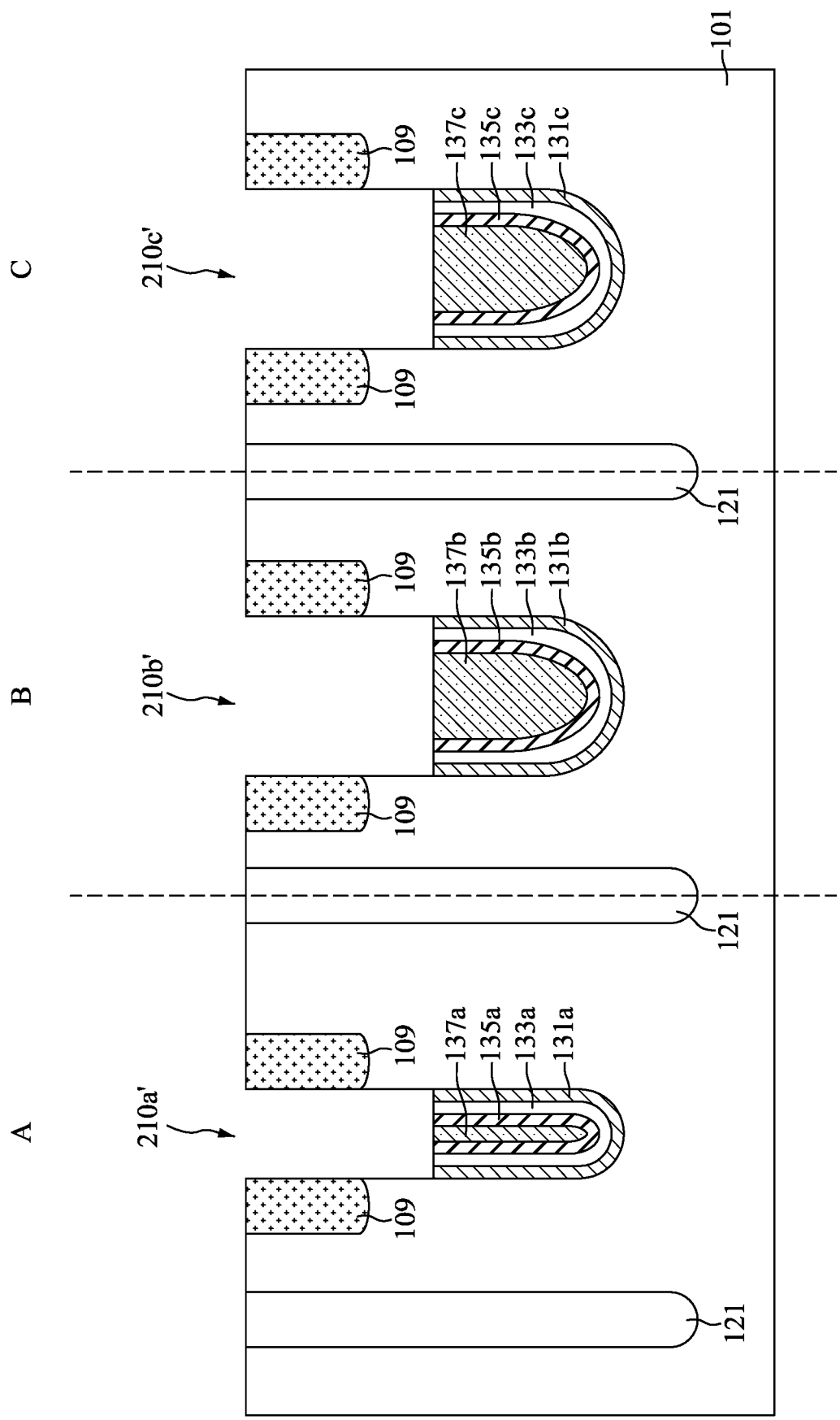
FIG. 27 is a cross-sectional view illustrating an intermediate stage of etching the work function metal material, the gate dielectric material, and the interfacial material using the sacrificial layers as an etch stop during the formation of the semiconductor device, in accordance with some embodiments.

Then, an etching process is performed on the work function metal material 135, the gate dielectric material 133, and the interfacial material 131, and the sacrificial layers 137a, 137b and 137c act as an etch stop layer to limit the etching process, as shown in FIG. 27 in accordance with some embodiments. After the etching process, a plurality of interfacial layers 131a, 131b, and 131c, a plurality of gate dielectric layers 133a, 133b, and 133c, and a plurality of work function metal layers 135a, 135b, and 135c are obtained.

Moreover, the recesses 210a, 210b and 210c are enlarged such that recesses 210a', 210b', and 210c' are obtained. In some embodiments, the recess 210a' is over the interfacial layer 131a, the gate dielectric layer 133a, the work function metal layer 135a, and the sacrificial layer 137a. In some embodiments, the recess 210b' is over the interfacial layer 131b, the gate dielectric layer 133b, the work function metal layer 135b, and the sacrificial layer 137b. In some embodiments, the recess 210c' is over the interfacial layer 131c, the gate dielectric layer 133c, the work function metal layer 135c, and the sacrificial layer 137c. In addition, the etching process may include a wet etching process, a dry etching process, or a combination thereof.

The following steps are similar to, or the same as the steps shown in FIGS. 16 to 23, and then, the isolation layers are formed over the buried gate structures to form the semiconductor device 100, as shown in FIG. 1.

Figure 28:
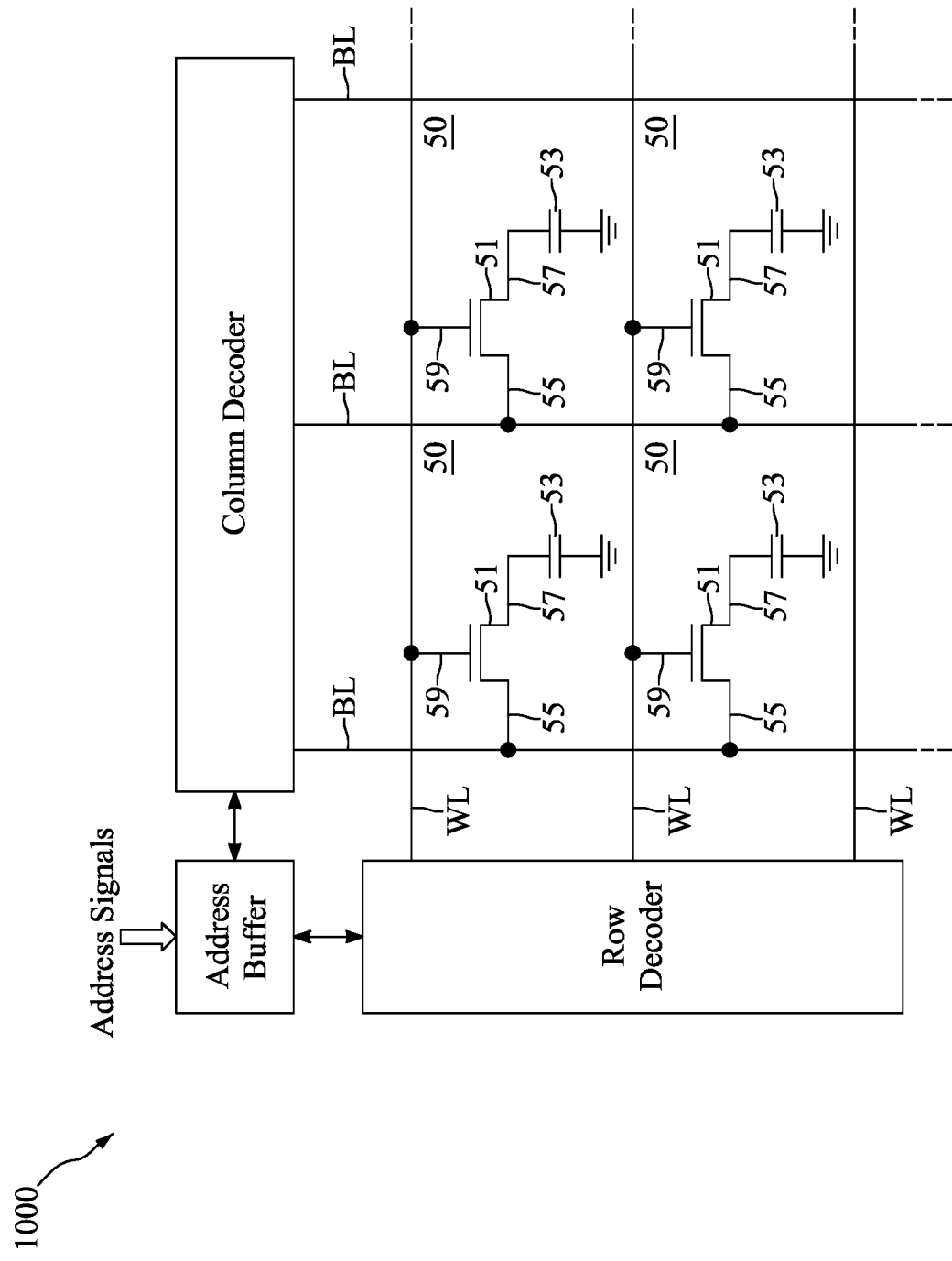
FIG. 28 is a partial schematic illustration of an exemplary integrated circuit, including an array of memory cells in accordance with some embodiments.

FIG. 28 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 1, the first device region A is in an array region, while the second device region B and the third device region C are in a peripheral circuit region. The array region may be any of the regions of the memory cells 50 in the memory device 1000, and the peripheral circuit region may be any of the regions of the address buffer, the row decoder, or the column decoder in the memory device 1000.

Embodiments of a semiconductor device and method for preparing the same are provided in the disclosure. In some embodiments, the semiconductor device 100 includes the buried gate structures 151a, 151b, and 151c disposed in the semiconductor substrate 101. The buried gate structure 151a includes the lower semiconductor layer 145a and the upper semiconductor layer 149a. The buried gate structure 151b includes the lower semiconductor layer 145b and the upper semiconductor layer 149b. The buried gate structure 151c includes the lower semiconductor layer 145c and the upper semiconductor layer 149c.

In some embodiments, the lower semiconductor layer 145a has a T-shaped profile, and each of the lower semiconductor layers 145b and 145c has a U-shaped profile. The different profiles are formed by depositing the lower semiconductor material 145 in trenches with different widths (e.g., the widths W1, W2, and W3), and etching the lower semiconductor material 145 to form the lower semiconductor layers 145a, 145b, and 145c. The trenches with different widths are in different device regions (e.g., the first device region A, the second device region B, and the third device region C), and the buried gate structures 151a, 151b, and 151c are subsequently formed in the trenches. Therefore, the buried gate structures 151a, 151b, and 151c in different device regions may be formed in the same process. As a result, manufacturing cost and processing time can be reduced.

In one embodiment of the present disclosure, a semiconductor device is provided. The semiconductor device includes a first buried gate structure disposed in a semiconductor substrate, and a second buried gate structure disposed in the semiconductor substrate and spaced from the first buried gate structure. The first buried gate structure includes a first gate dielectric layer, and a first lower semiconductor layer disposed over the first gate dielectric layer. The first lower semiconductor layer has a T-shaped profile in a cross-sectional view. The first buried gate structure also includes a first upper semiconductor layer disposed over the first lower semiconductor layer. The second buried gate structure includes a second gate dielectric layer, and a second lower semiconductor layer disposed over the second gate dielectric layer. The second lower semiconductor layer has a U-shaped profile in the cross-sectional view. The second buried gate structure also includes a second upper semiconductor layer disposed over the second lower semiconductor layer.

In another embodiment of the present disclosure, a semiconductor device is provided. The semiconductor device includes a first buried gate structure, a second buried gate structure, and a third buried gate structure disposed in a semiconductor substrate. The first buried gate structure includes a first gate dielectric layer, a first lower semiconductor layer disposed over the first gate dielectric layer, and a first upper semiconductor layer disposed over the first lower semiconductor layer. An interface between the first lower semiconductor layer and the first upper semiconductor layer is planar. The second buried gate structure includes a second gate dielectric layer, a second lower semiconductor layer disposed over the second gate dielectric layer, and a second upper semiconductor layer disposed over the second lower semiconductor layer. An interface between the second lower semiconductor layer and the second upper semiconductor layer is U-shaped. The third buried gate structure includes a third gate dielectric layer, a work function metal layer disposed over the third gate dielectric layer, a third lower semiconductor layer disposed over the work function metal layer, and a third upper semiconductor layer disposed over the third lower semiconductor layer. An interface between the third lower semiconductor layer and the third upper semiconductor layer is U-shaped.

In yet another embodiment of the present disclosure, a method for preparing a semiconductor device is provided. The method includes forming a first trench and a second trench in a semiconductor substrate, and forming a first gate dielectric layer lining the first trench, and forming a second gate dielectric layer lining the second trench. The method also includes depositing a lower semiconductor material over the semiconductor substrate, wherein the first gate dielectric layer and the second gate dielectric layer are covered by the lower semiconductor material, and filling the first trench and the second trench with a sacrificial material after the lower semiconductor material is deposited. The method further includes etching the lower semiconductor material and the sacrificial material to form a first lower semiconductor layer in the first trench and to form a second lower semiconductor layer and a first sacrificial layer in the second trench. The first lower semiconductor layer has a T-shaped profile in a cross-sectional view, and the first sacrificial layer is surrounded by the second lower semiconductor layer. In addition, the method includes removing the first sacrificial layer, depositing a first upper semiconductor layer in the first trench and over the first lower semiconductor layer, and depositing a second upper semiconductor layer in the second trench and over the second lower semiconductor layer.

The embodiments of the present disclosure have some advantageous features. In some embodiments, the semiconductor device includes buried gate structures with different widths in different device regions, and the buried gate structures may be formed in the same process. As a result, manufacturing cost and processing time can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
a first buried gate structure disposed in a semiconductor substrate, wherein the first buried gate structure comprises:
a first gate dielectric layer;
a first lower semiconductor layer disposed over the first gate dielectric layer, wherein the first lower semiconductor layer has a T-shaped profile in a cross-sectional view; and a first upper semiconductor layer disposed over the first lower semiconductor layer;
a second buried gate structure disposed in the semiconductor substrate and spaced from the first buried gate structure, wherein the second buried gate structure comprises:
a second gate dielectric layer;
a second lower semiconductor layer disposed over the second gate dielectric layer, wherein the second lower semiconductor layer has a U-shaped profile in the cross-sectional view; and
a second upper semiconductor layer disposed over the second lower semiconductor layer;
a third buried gate structure disposed in the semiconductor substrate and spaced from the first buried gate structure and the second buried gate structure;
wherein the first buried gate structure is disposed in an array region, and the second buried gate structure is disposed in a peripheral circuit region;
wherein the second upper semiconductor layer extends lower than a top surface of the second gate dielectric layer.

2. The semiconductor device of claim 1, wherein the first buried gate structure has a first width, the second buried gate structure has a second width, and the second width is greater than the first width.

3. The semiconductor device of claim 1, wherein the first lower semiconductor layer and the first upper semiconductor layer form a planar interface.

4. The semiconductor device of claim 1, wherein the first lower semiconductor layer and the second lower semiconductor layer comprise polysilicon or silicon germanium (SiGe), and the first upper semiconductor layer and the second upper semiconductor layer comprise germanium (Ge).

5. The semiconductor device of claim 1, wherein the top surface of the second gate dielectric layer is covered by the second lower semiconductor layer.

6. The semiconductor device of claim 1, wherein the third buried gate structure comprises:
a third gate dielectric layer;
a work function metal layer disposed over the third gate dielectric layer;
a third lower semiconductor layer disposed over the third work function metal layer, wherein the third lower semiconductor layer has a U-shaped profile in the cross-sectional view; and
a third upper semiconductor layer disposed over the third lower semiconductor layer.

7. The semiconductor device of claim 1, wherein the first buried gate structure has a first width, the third buried gate structure has a third width, and the third width is greater than the first width.

8. The semiconductor device of claim 1, wherein the first buried gate structure is disposed in an array region, and the second buried gate structure and the third gate structure are disposed in a peripheral circuit region, and
wherein the second buried gate structure is in an n-type field effect transistor (NFET), and the third buried gate structure is in a p-type field effect transistor (PFET).

9. The semiconductor device of claim 1, wherein the third upper semiconductor layer extends lower than a top surface of the work function metal layer.

10. The semiconductor device of claim 9, wherein the top surface of the work function metal layer is covered by the third lower semiconductor layer.

11. A semiconductor device, comprising:
a first buried gate structure disposed in a semiconductor substrate, wherein the first buried gate structure comprises:
a first gate dielectric layer;
a first lower semiconductor layer disposed over the first gate dielectric layer; and
a first upper semiconductor layer disposed over the first lower semiconductor layer, wherein an interface between the first lower semiconductor layer and the first upper semiconductor layer is planar;
a second buried gate structure disposed in the semiconductor substrate, wherein the second buried gate structure comprises:
a second gate dielectric layer;
a second lower semiconductor layer disposed over the second gate dielectric layer; and
a second upper semiconductor layer disposed over the second lower semiconductor layer, wherein an interface between the second lower semiconductor layer and the second upper semiconductor layer is U-shaped;
a third buried gate structure disposed in the semiconductor substrate, wherein the third buried gate structure comprises:
a third gate dielectric layer;
a work function metal layer disposed over the third gate dielectric layer;
a third lower semiconductor layer disposed over the work function metal layer; and
a third upper semiconductor layer disposed over the third lower semiconductor layer, wherein an interface between the third lower semiconductor layer and the third upper semiconductor layer is U-shaped;
a first isolation layer disposed in the semiconductor substrate and over the first buried gate structure, wherein the first lower semiconductor layer is separated from the first isolation layer by the first upper semiconductor layer; and
a second isolation layer disposed in the semiconductor substrate and over the second buried gate structure, wherein the second lower semiconductor layer is separated from the second isolation layer by the second upper semiconductor layer, and wherein a width of the second isolation layer is greater than a width of the first isolation layer;
wherein the first buried gate structure has a first width, the second buried gate structure has a second width, the third buried gate structure has a third width, and the first width is less than the second width and the third width.

12. The semiconductor device of claim 11, wherein the first buried gate structure is disposed in an array region, and the second buried gate structure and the third buried gate structure are disposed in a peripheral circuit region.

13. The semiconductor device of claim 12, wherein the first buried gate structure is in a first n-type field effect transistor (NFET), the second buried gate structure is in a second n-type field effect transistor (NFET), and the third buried gate structure is in a p-type field effect transistor (PFET).

14. The semiconductor device of claim 11, wherein the first lower semiconductor layer, the second lower semiconductor layer, and the third lower semiconductor layer comprise polysilicon or silicon germanium (SiGe).

15. The semiconductor device of claim 11, wherein the first upper semiconductor layer, the second upper semiconductor layer, and the third upper semiconductor layer comprise germanium (Ge).

* * * * *